(12) United States Patent
Takeshita et al.

(10) Patent No.: US 10,994,341 B2
(45) Date of Patent: May 4, 2021

(54) SURFACE-COATED CUTTING TOOL AND METHOD FOR MANUFACTURING SAME

(71) Applicant: Sumitomo Electric Hardmetal Corp., Itami (JP)

(72) Inventors: Hiroki Takeshita, Itami (JP); Makoto Setoyama, Itami (JP); Haruyo Fukui, Itami (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 82 days.

(21) Appl. No.: 16/494,125

(22) PCT Filed: Mar. 8, 2019

(86) PCT No.: PCT/JP2019/009316
§ 371 (c)(1),
(2) Date: Sep. 13, 2019

(87) PCT Pub. No.: WO2019/239654
PCT Pub. Date: Dec. 19, 2019

(65) Prior Publication Data
US 2021/0001410 A1  Jan. 7, 2021

(30) Foreign Application Priority Data
Jun. 15, 2018 (JP) .............................. JP2018-114267

(51) Int. Cl.
*B23B 27/14* (2006.01)
*C23C 14/06* (2006.01)
(Continued)

(52) U.S. Cl.
CPC ........ *B23B 27/148* (2013.01); *C23C 14/0641* (2013.01); *C23C 14/0664* (2013.01);
(Continued)

(58) Field of Classification Search
CPC ... B23B 27/14; B23B 27/148; B23B 2228/10; C23C 14/06; C23C 14/0641;
(Continued)

(56) References Cited

U.S. PATENT DOCUMENTS

| 2007/0269610 A1 | 11/2007 | Fukui et al. |
| 2012/0090247 A1* | 4/2012 | Miura ................... C04B 41/52 |
| | | 51/309 |

(Continued)

FOREIGN PATENT DOCUMENTS

| JP | H07-310174 A | 11/1995 |
| JP | 2005-305576 A | 11/2005 |

(Continued)

*Primary Examiner* — Archene A Turner
(74) *Attorney, Agent, or Firm* — Baker Botts L.L.P.; Michael A. Sartori

(57) ABSTRACT

A surface-coated cutting tool includes a base material and a coating film provided on a surface of the base material, wherein the coating film includes a first alternating layer provided on the base material and a second alternating layer provided on the first alternating layer, the first alternating layer includes A and B layers, the second alternating layer includes C and D layers, each of one or plurality of the A layers is composed of a nitride or carbonitride of $Al_aCr_bM1_{(1-a-b)}$, each of one or plurality of the B layers is composed of a nitride or carbonitride of $Al_cTi_dM2_{(1-c-d)}$, each of one or plurality of the C layers is composed of a nitride or carbonitride of $Ti_eSi_fM3_{(1-e-f)}$, and each of one or plurality of the D layers is composed of a nitride or carbonitride of $Ti_gSi_hM4_{(1-g-h)}$.

13 Claims, 2 Drawing Sheets

(51) Int. Cl.
*C23C 28/04* (2006.01)
*B23C 5/20* (2006.01)
*C23C 14/32* (2006.01)
*C23C 14/35* (2006.01)

(52) U.S. Cl.
CPC .......... *C23C 28/042* (2013.01); *C23C 28/044* (2013.01); *B23B 2228/10* (2013.01); *B23C 5/202* (2013.01); *C23C 14/325* (2013.01); *C23C 14/35* (2013.01)

(58) Field of Classification Search
CPC ... C23C 14/0664; C23C 14/35; C23C 28/042; C23C 28/044
USPC .......... 51/307, 309; 428/216, 336, 697, 696, 428/699, 704
See application file for complete search history.

(56) References Cited

U.S. PATENT DOCUMENTS

| | | | |
|---|---|---|---|
| 2015/0203956 A1* | 7/2015 | Asari | C23C 28/044 428/216 |
| 2016/0175939 A1* | 6/2016 | Tanaka | C23C 14/0641 428/216 |
| 2017/0029931 A1* | 2/2017 | Hirano | B23B 51/00 |
| 2018/0099335 A1* | 4/2018 | Takeshita | C23C 14/0664 |

FOREIGN PATENT DOCUMENTS

| | | | |
|---|---|---|---|
| JP | 2006-043874 A | | 2/2006 |
| JP | 2007-136655 A | | 6/2007 |
| JP | 2007-152542 A | | 6/2007 |
| JP | 2010-099769 | * | 5/2010 |
| JP | 2017-177239 A | | 10/2017 |
| WO | 2006/070730 A1 | | 7/2006 |

* cited by examiner

SURFACE-COATED CUTTING TOOL AND METHOD FOR MANUFACTURING SAME

TECHNICAL FIELD

The present disclosure relates to a surface-coated cutting tool and a method for manufacturing the surface-coated cutting tool. The present application claims a priority based on Japanese Patent Application No. 2018-114267 filed on Jun. 15, 2018, the entire content of which is incorporated herein by reference.

BACKGROUND ART

Recent trends for cutting tools are as follows: (1) dry processing employing no cutting fluid is required in view of global environmental protection; (2) various types of workpieces are used; and (3) cutting speed becomes faster in order to further increase cutting efficiency. Under such circumstances, a tool edge temperature of a cutting tool during cutting tends to be increasingly higher. This leads to a reduced life of the cutting tool, with the result that characteristics required for a material of the cutting tool are becoming increasingly severe. Meanwhile, in processing that places an importance on finished surface quality and size of a workpiece such as finish processing, deteriorated cutting edge quality of the cutting tool affects cutting performance. Examples of the deteriorated cutting edge quality includes: chipping of a coating film that coats a base material of the cutting tool; detachment of the coating film; or the like. Hence, in order to suppress the chipping of the coating film and the detachment of the coating film, various measures have been taken.

CITATION LIST

Patent Literature

PTL 1: Japanese Patent Laying-Open No. 07-310174
PTL 2: Japanese Patent Laying-Open No. 2005-305576
PTL 3: WO 2006/070730
PTL 4: Japanese Patent Laying-Open No. 2017-177239

SUMMARY OF INVENTION

A surface-coated cutting tool according to one embodiment of the present disclosure is a surface-coated cutting tool including a base material and a coating film provided on a surface of the base material, wherein
the coating film includes a first alternating layer provided on the base material and a second alternating layer provided on the first alternating layer,
the first alternating layer includes A and B layers,
the second alternating layer includes C and D layers,
one or a plurality of the A layers and one or a plurality of the B layers are layered alternately,
one or a plurality of the C layers and one or a plurality of the D layers are layered alternately,
each of the one or plurality of the A layers is composed of a nitride or carbonitride of $Al_aCr_bM1_{(1-a-b)}$, and respective atomic ratios of metal atoms in the A layer satisfy $0.5 \le a \le 0.9$, $0 < b \le 0.4$, and $0 \le (1-a-b) \le 0.1$,
each of the one or plurality of the B layers is composed of a nitride or carbonitride of $Al_cTi_dM2_{(1-c-d)}$, and respective atomic ratios of metal atoms in the B layer satisfy $0.3 \le c \le 0.7$, $0.3 \le d \le 0.7$, and $0 \le (1-c-d) \le 0.1$,
each of the one or plurality of the C layers is composed of a nitride or carbonitride of $Ti_eSi_fM3_{(1-e-f)}$, and respective atomic ratios of metal atoms in the C layer satisfy $0.75 \le e \le 0.99$, $0.01 \le f \le 0.2$, and $0 \le (1-e-f) \le 0.1$,
each of the one or plurality of the D layers is composed of a nitride or carbonitride of $Ti_gSi_hM4_{(1-g-h)}$, and respective atomic ratios of metal atoms in the D layer satisfy $0.8 \le g \le 0.99$, $0.01 \le h \le 0.2$, and $0 \le (1-g-h) \le 0.1$,
the atomic ratio e of Ti in the C layer and the atomic ratio g of Ti in the D layer satisfy $0.05 \le |g-e| \le 0.2$,
the atomic ratio f of Si in the C layer and the atomic ratio h of Si in the D layer satisfy $0.05 \le |h-f| \le 0.2$,
each of the M1 and the M2 is independently one or more elements selected from a group consisting of Si and B, and
each of the M3 and the M4 is independently one or more elements selected from a group consisting of Ta and B.

A method for manufacturing a surface-coated cutting tool according to one embodiment of the present disclosure is a method for manufacturing the above-described surface-coated cutting tool, the method including:
preparing the base material; and
forming the first alternating layer by using a physical vapor deposition method to alternately layer the one or plurality of the A layers and the one or plurality of the B layers on the base material; and
forming the second alternating layer by using the physical vapor deposition method to alternately layer the one or plurality of the C layers and the one or plurality of the D layers on the first alternating layer.

DETAILED DESCRIPTION

Figure 1:
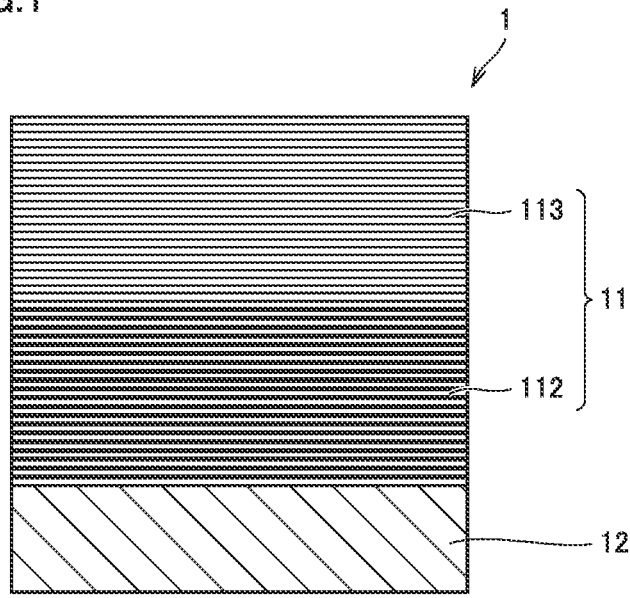
FIG. 1 is a schematic cross sectional view of a surface-coated cutting tool in one form of the present embodiment.

[Problem to be Solved by the Present Disclosure]
Japanese Patent Laying-Open No. 07-310174 (Patent Literature 1) discloses a cutting tool, wherein a surface of a hard base material, such as a WC-based cemented carbide, cermet, or high-speed steel, of each of a cutting tool, a wear-resistant tool, and the like is coated with an AlTiSi-based film as a hard coating layer in order to improve wear resistance and surface protection function. Examples of the AlTiSi-based film include $(Al_xTi_{1-x-y}Si_y)(C_zN_{1-z})$ (where $0.05 \le x \le 0.75$, $0.01 \le y \le 0.1$, and $0.6 \le z \le 1$).

The cutting tool described in Patent Literature 1 has high hardness and excellent oxidation resistance, but is brittle and tends to be likely to be chipped.

On the other hand, for example, in a cutting tool disclosed in Japanese Patent Laying-Open No. 2005-305576 (Patent Literature 2), a surface of a base material is coated with a wear-resistant coating film and a surface of this wear-resistant coating film is coated with a chipping-resistant coating film. The wear-resistant coating film is mainly composed of a carbide or carbonitride of $Ti_{1-x}Al_x$ (where $0.2 \leq x \leq 0.7$). The chipping-resistant coating film is composed of one or more of a nitride or carbonitride of $Al_{1-a-b}Cr_aV_b$ (where $0 \leq a \leq 0.4$, $0 \leq b \leq 0.4$, and $a+b \leq 0.4$). In this way, occurrence of chipping (or breakage) of the cutting edge, i.e., exposure of the base material at an early stage of cutting is suppressed, thereby improving the tool life.

However, in the cutting tool described in Patent Literature 2, for example, when cutting a material, such as stainless steel, with which the cutting edge is likely to be welded, adhesion is low between the chipping-resistant layer serving as an outer layer and the wear-resistant layer serving as a lower layer at the early stage of cutting, with the result that the coating film tends to be detached. Hence, there is room for improvement as to suppression of chipping of the coating film.

Meanwhile, in a cutting tool described in WO 2006/070730 (Patent Literature 3), in order to improve wear resistance and chipping resistance, a coating layer includes an alternating layer in which one or more A layers and one or more B layers are layered alternately. Each of the A layers has characteristics, such as compressive residual stress and hardness, different from those of each of the B layers. Accordingly, the wear resistance and toughness of the whole of the coating layer are improved.

However, in the cutting tool described in Patent Literature 3, for example, during processing, such as processing of a difficult-to-cut material, which is likely to involve welding of the cutting edge of the cutting tool and detachment of the coating film due to the welding, the coating layer reacts with the workpiece at an early stage of cutting, with the result that a crack tends to be generated between the A and B layers, which have different compositions. Accordingly, layer detachment occurs due to chipping in the coating film, with the result that the cutting tool tends to have a short life.

In a cutting tool described in Japanese Patent Laying-Open No. 2017-177239 (Patent Literature 4), in order to improve wear resistance and chipping resistance, a coating film includes a coating layer in which an alternating layer B having excellent chipping resistance is layered on top of an alternating layer A having excellent wear resistance, thereby improving the wear resistance and chipping resistance of the whole of the coating film.

However, in the cutting tool described in Patent Literature 4, under processing conditions involving a high temperature of the cutting edge, such as processing of stainless steel or a difficult-to-cut material, the heat resistance of alternating layer B serving as an upper layer tends to be low. Accordingly, the coating film has developed oxidative wear, with the result that the cutting tool tends to have a short life.

The present disclosure has been made in view of the above-described circumstance, and has an object to provide a surface-coated cutting tool having excellent chipping resistance and excellent wear resistance.

Advantageous Effect of the Present Disclosure

According to the present disclosure, there can be provided a surface-coated cutting tool having excellent chipping resistance and excellent wear resistance.

Description of Embodiments

First, embodiments of the present invention are listed and described.

[1] A surface-coated cutting tool according to one embodiment of the present disclosure is a surface-coated cutting tool including a base material and a coating film provided on a surface of the base material, wherein the coating film includes a first alternating layer provided on the base material and a second alternating layer provided on the first alternating layer, the first alternating layer includes A and B layers, the second alternating layer includes C and D layers, one or a plurality of the A layers and one or a plurality of the B layers are layered alternately, one or a plurality of the C layers and one or a plurality of the D layers are layered alternately, each of the one or plurality of the A layers is composed of a nitride or carbonitride of $Al_aCr_bM1_{(1-a-b)}$, and respective atomic ratios of metal atoms in the A layer satisfy $0.5 \leq a \leq 0.9$, $0 \leq b \leq 0.4$, and $0 \leq (1-a-b) \leq 0.1$, each of the one or plurality of the B layers is composed of a nitride or carbonitride of $Al_cTi_dM2_{(1-c-d)}$, and respective atomic ratios of metal atoms in the B layer satisfy $0.3 \leq c \leq 0.7$, $0.3 \leq d \leq 0.7$, and $0 \leq (1-c-d) \leq 0.1$, each of the one or plurality of the C layers is composed of a nitride or carbonitride of $Ti_eSi_fM3_{(1-e-f)}$, and respective atomic ratios of metal atoms in the C layer satisfy $0.75 \leq e \leq 0.99$, $0.01 \leq f \leq 0.2$, and $0 \leq (1-e-f) \leq 0.1$, each of the one or plurality of the D layers is composed of a nitride or carbonitride of $Ti_gSi_hM4_{(1-g-h)}$, and respective atomic ratios of metal atoms in the D layer satisfy $0.8 \leq g \leq 0.99$, $0.01 \leq h \leq 0.2$, and $0 \leq (1-g-h) \leq 0.1$, the atomic ratio e of Ti in the C layer and the atomic ratio g of Ti in the D layer satisfy $0.05 \leq |g-e| \leq 0.2$, the atomic ratio f of Si in the C layer and the atomic ratio h of Si in the D layer satisfy $0.05 \leq |h-f| \leq 0.2$, each of the M1 and the M2 is independently one or more elements selected from a group consisting of Si and B, and each of the M3 and the M4 is independently one or more elements selected from a group consisting of Ta and B. The surface-coated cutting tool having such a configuration can exhibit excellent chipping resistance and wear resistance.

[2] The coating film further includes an intermediate layer between the first alternating layer and the second alternating layer, and the intermediate layer is an alternating layer of the A and C layers, an alternating layer of the A and D layers, an alternating layer of the B and C layers, or an alternating layer of the B and D layers. Accordingly, more excellent chipping resistance and wear resistance can be exhibited.

[3] An uppermost layer of the first alternating layer is the B layer. Accordingly, adhesion between the first alternating layer and the second alternating layer or the intermediate layer can be stronger.

[4] A lowermost layer of the first alternating layer is the A layer or the B layer. Accordingly, the coating film can be suppressed more from being detached.

[5] The A layer in the first alternating layer has a thickness $\lambda a$ of more than or equal to 0.005 μm and less than or equal to 2 μm, the B layer in the first alternating layer has a thickness $\lambda b$ of more than or equal to 0.002 μm and less than or equal to 2 μm, and a ratio $\lambda a/\lambda b$ of the thickness of the A layer in the first alternating layer and the thickness of the B layer in the first alternating layer satisfies $1 \leq \lambda a/\lambda b \leq 5$. Accordingly, the oxidation resistance of the coating film can be improved and the coating film can have high hardness.

[6] The C layer in the second alternating layer has a thickness of more than or equal to 0.005 μm and less than or equal to 2 μm, the D layer in the second alternating layer has a thickness λd of more than or equal to 0.001 μm and less than or equal to 2 μm, and a ratio λc/λd of the thickness of the C layer in the second alternating layer and the thickness of the D layer in the second alternating layer satisfies 1≤λc/λd≤5. Accordingly, a crack can be suppressed more from being developed in the coating film.

[7] The coating film has an entire thickness of more than or equal to 0.5 μm and less than or equal to 15 μm. Accordingly, the coating film can be excellent in chipping resistance, thus improving the tool life.

[8] The coating film further includes an adhesion layer between the base material and the first alternating layer, the adhesion layer has a thickness of more than or equal to 0.5 nm and less than or equal to 20 nm, and the adhesion layer includes a carbide, nitride, or carbonitride including one or more first elements, one or more second elements, and one or more third elements, the one or more first elements being selected from a group consisting of Cr, Ti, Zr and Nb, the one or more second elements being selected from elements of the base material, the one or more third elements being selected from the elements of the first alternating layer or the second alternating layer. Accordingly, adhesion between the coating film and the base material can be improved.

[9] The one or more second elements at least include W. Accordingly, adhesion between the coating film and the base material can be improved.

[10] The base material includes hard particles containing WC and a binder phase for binding the hard particles to each other, the binder phase includes Co, the adhesion layer includes a carbide, nitride, or carbonitride including W, Cr, Ti, Al, and M5, and the M5 is one or more elements selected from a group consisting of a group 4 element, a group 5 element, a group 6 element except W, Cr, and Ti in a periodic table, Si and B. Accordingly, the adhesion between the coating film and the base material can be improved more.

[11] The first alternating layer includes a cubic crystal structure, and the second alternating layer includes a cubic crystal structure. Accordingly, hardness of the coating film can be improved.

[12] A method for manufacturing a surface-coated cutting tool according to one embodiment of the present disclosure is a method for manufacturing the above-described surface-coated cutting tool, the method including:

preparing the base material; and forming the first alternating layer by using a physical vapor deposition method to alternately layer the one or plurality of the A layers and the one or plurality of the B layers on the base material; and forming the second alternating layer by using the physical vapor deposition method to alternately layer the one or plurality of the C layers and the one or plurality of the D layers on the first alternating layer. Accordingly, a surface-coated cutting tool exhibiting excellent chipping resistance and wear resistance can be manufactured.

[13] The physical vapor deposition method is at least one selected from a group consisting of a cathode arc ion plating method, a balanced magnetron sputtering method, and an unbalanced magnetron sputtering method. Accordingly, the surface-coated cutting tool having the above-described capability can be manufactured with a good yield.

Details of Embodiments of the Present Invention

The following describes an embodiment (hereinafter, referred to as "the present embodiment") of the present invention more in detail. The embodiment below will be described with reference to figures and the same reference characters in the figures represent the same or corresponding portions.

Here, in the present specification, the expression "X to Y" represents a range of lower to upper limits (i.e., more than or equal to X and less than or equal to Y). When no unit is indicated for X and a unit is indicated only for Y, the unit of X is the same as the unit of Y. Moreover, when a compound is expressed by a chemical formula in the present specification and an atomic ratio is not particularly limited, it is assumed that all the conventionally known atomic ratios are included. The atomic ratio is not necessarily limited only to one in the stoichiometric range. For example, when "TiAlN" is described, an atomic ratio in the TiAlN is not limited to those in stoichiometric compositions such as Ti:Al:N=0.5:0.5:1, and include all the conventionally known atomic ratios such as those in non-stoichiometric compositions such as Ti:Al:N=0.6:0.5:1. The same also applies to compounds other than the "TiAlN". In the present embodiment, a metallic element and a nonmetallic element does not necessarily need to constitute a stoichiometric composition. Examples of the metallic element include titanium (Ti), aluminum (Al), silicon (Si), tantalum (Ta), and chromium (Cr). Examples of the nonmetallic element include nitrogen (N), oxygen (O), and carbon (C).

A surface-coated cutting tool according to the present embodiment is a surface-coated cutting tool including a base material and a coating film provided on a surface of the base material, wherein the coating film includes a first alternating layer provided on the base material and a second alternating layer provided on the first alternating layer, the first alternating layer includes A and B layers, the second alternating layer includes C and D layers, one or a plurality of the A layers and one or a plurality of the B layers are layered alternately, one or a plurality of the C layers and one or a plurality of the D layers are layered alternately, each of the one or plurality of the A layers is composed of a nitride or carbonitride of $Al_aCr_bM1_{(1-a-b)}$, and respective atomic ratios of metal atoms in the A layer satisfy 0.5≤a≤0.9, 0≤b≤0.4, and 0≤(1-a-b)≤0.1, each of the one or plurality of the B layers is composed of a nitride or carbonitride of $Al_cTi_dM2_{(1-c-d)}$, and respective atomic ratios of metal atoms in the B layer satisfy 0.3≤c≤0.7, 0.3≤d≤0.7, and 0≤(1-c-d)≤0.1, each of the one or plurality of the C layers is composed of a nitride or carbonitride of $Ti_eSi_fM3_{(1-e-f)}$, and respective atomic ratios of metal atoms in the C layer satisfy 0.75≤e≤0.99, 0.01≤f≤0.2, and 0≤(1-e-f)≤0.1, each of the one or plurality of the D layers is composed of a nitride or carbonitride of $Ti_gSi_hM4_{(1-g-h)}$, and respective atomic ratios of metal atoms in the D layer satisfy 0.8≤g≤0.99, 0.01≤h≤0.2, and 0≤(1-g-h)≤0.1, the atomic ratio e of Ti in the C layer and the atomic ratio g of Ti in the D layer satisfy 0.05≤|g-e|≤0.2, the atomic ratio f of Si in the C layer and the atomic ratio h of Si in the D layer satisfy 0.05≤|h-f|≤0.2, each of the M1 and the M2 is independently one or more elements selected from a group consisting of Si and B, and each of the M3 and the M4 is independently one or more elements selected from a group consisting of Ta and B.

With the above-described configuration, the surface-coated cutting tool according to the present embodiment exhibits excellent chipping resistance and wear resistance.

Hence, the surface-coated cutting tool can withstand severe cutting conditions and can have excellent cutting edge quality.

<Surface-Coated Cutting Tool>

The surface-coated cutting tool (hereinafter, also simply referred to as "cutting tool") according to the present embodiment includes the base material and the coating film provided on the surface of the base material. Examples of the surface-coated cutting tool having such a basic configuration includes a drill, an end mill, an indexable cutting insert for drill, an indexable cutting insert for end mill, an indexable cutting insert for milling or turning, a metal saw, a gear cutting tool, a reamer, a tap, an insert for crankshaft pin milling, or the like.

FIG. 1 is a schematic cross sectional view of the surface-coated cutting tool in one form of the present embodiment. For example, as shown in FIG. 1, a surface-coated cutting tool 1 in the one form of the present embodiment includes a base material 12 and a coating film 11 provided on a surface of base material 12.

<Base Material>

For the base material, any conventionally known type of base material can be used. For example, the base material preferably includes at least one selected from a group consisting of: a cemented carbide (such as a tungsten carbide (WC) based cemented carbide, a cemented carbide including WC and Co (cobalt), and a cemented carbide including WC and a carbonitride of Ti (titanium), Ta (tantalum), Nb (niobium) or the like, for example); a cermet (mainly composed of titanium carbide, titanium nitride, titanium carbonitride, or the like); a high-speed steel; a ceramic (titanium carbide, silicon carbide, silicon nitride, aluminum nitride, aluminum oxide, or the like); a cubic boron nitride sintered material; and a diamond sintered material. When the WC-based cemented carbide is used as the base material, one or both of free carbon and an abnormal layer called "η phase" may be included in the structure of the WC-based cemented carbide.

Among these various types of base materials, it is preferable to select the cemented carbide, particularly, the WC-based cemented carbide or to select the cermet (particularly, the titanium carbonitride based cermet). Each of these base materials is excellent in balance between hardness and strength particularly at a high temperature, and has characteristics excellent as a base material for the cutting tools in the above-described applications. Particularly, when the WC-based cemented carbide is selected, it is more preferable that: the base material includes hard particles including WC and includes a binder phase for binding the hard particles to each other; and the binder phase includes Co.

Further, when the surface-coated cutting tool includes a below-described adhesion layer and the base material includes the WC-based cemented carbide, it is more preferable that WC occupies more than or equal to 80% of an area in contact with the adhesion layer in the surface of the base material in view of adhesion between the base material and the coating film. Each of these base materials may have a modified surface. For example, a cemented carbide having a surface in which a β-free layer is formed does not fall out of the scope of the present disclosure.

It should be noted that when the cutting tool is an indexable cutting insert or the like, the base material includes a shape having a chip breaker or includes a shape having no chip breaker. For the shape of a ridgeline portion of the cutting edge, any of the following shapes is included: a sharp edge (ridge at which a rake face and a flank face cross each other); a honing (shape obtained by providing a curvature to the sharp edge); a negative land (chamfered shape); a shape obtained by combining the honing and the negative land; and the like.

<Coating Film>

As shown in FIG. 1, a coating film 11 according to the present embodiment includes: a first alternating layer 112 provided on base material 12; and a second alternating layer 113 provided on first alternating layer 112. Here, first alternating layer 112 may be provided directly in contact with a surface of base material 12 or may be provided on base material 12 with a below-described adhesion layer being interposed therebetween. Likewise, second alternating layer 113 may be provided directly in contact with a surface of first alternating layer 112 or may be provided on the first alternating layer with a below-described intermediate layer being interposed therebetween. First alternating layer 112 includes A and B layers. Second alternating layer 113 includes C and D layers. One or plurality of the A layers and one or plurality of the B layers are layered alternately. One or plurality of the C layers and one or plurality of the D layers are layered alternately. First alternating layer 112 is a multilayer film constituted of two or more layers to provide wear resistance in particular, and may be referred to as "wear-resistant layer" in the present specification. Moreover, since second alternating layer 113 is provided on first alternating layer 112, first alternating layer 112 may be referred to as "lower layer" in the present specification.

Second alternating layer 113 is a multilayer film constituted of two or more layers to provide heat resistance in particular, and may be referred to as "heat-resistant layer" in the present specification. Moreover, since second alternating layer 113 is provided on first alternating layer 112, second alternating layer 113 may be referred to as "upper layer" in the present specification.

In the present embodiment, coating film 11 coats base material 12. Coating film 11 preferably coats the entire surface of the base material. However, even when base material 12 is not partially coated with coating film 11 or even when respective layer structures of the layers of coating film 11 are partially different, these configurations do not fall out of the scope of the present disclosure.

The coating film can include other layer(s) in addition to the first alternating layer, the second alternating layer, the below-described intermediate layer, and the below-described adhesion layer. For example, the coating film can include an underlying layer as a layer provided to face the base material. Examples of the underlying layer can include a solid solution layer including an element of the coating film. The inclusion of the solid solution layer leads to more secured uniformity of the coating film. Furthermore, the coating film can also include a surface protection layer as a layer for protecting a surface, for example. It should be noted that these layers can be formed by well-known formation methods.

Examples of the surface protection layer include an α-$Al_2O_3$ layer and a κ-$Al_2O_3$ layer.

In the present embodiment, the first alternating layer excellent in wear resistance and the second alternating layer excellent in heat resistance are layered in the coating film, thereby satisfactorily eliminating a disadvantage (such as brittleness) of each of the first alternating layer and the second alternating layer while maintaining suitable characteristics intrinsic to the first alternating layer and the second alternating layer. Further, each of the first alternating layer and the second alternating layer has a multilayer structure in which the one or plurality of the layers of one of the two types of unit layers and the one or plurality of the layers of the other of the two types of unit layers are layered alternately, whereby the strength of the coating film can be improved significantly as compared with a case of forming either of the unit layers solely. When forming either of the unit layers solely, brittleness tends to be increased more as the layer thickness becomes thicker. However, the brittleness can be suppressed by forming the multilayer structure such that the one or plurality of layers of one of the two types of unit layers and the one or plurality of layers of the other of the two types of unit layers are alternately layered to control the thickness per unit layer to be thin.

In the present specification, the term "film" or "layer" is used for each constituent unit of the coating film for the purpose of convenience; however, such use of the terms is not intended to explicitly distinguish between the "film" and the "layer".

The coating film preferably has an entire thickness of more than or equal to 0.5 µm and less than or equal to 15 µm. The upper limit of the entire thickness is more preferably less than or equal to 10 µm, is further preferably less than or equal to 6 µm, and is still more preferably less than or equal to 5 µm. The lower limit of the entire thickness may be more than or equal to 0.5 µm, for example. When the entire thickness of the coating film is less than 0.5 µm, the thickness of the coating film is too thin, with the result that the life of the surface-coated cutting tool tends to be short. On the other hand, when the entire thickness of the coating film is more than 15 µm, the coating film is likely to be chipped at an early stage of cutting, with the result that the life of the surface-coated cutting tool tends to be short. The entire thickness of the coating film is intended to mean the thickness of all of the first alternating layer, the second alternating layer, the below-described intermediate layer and adhesion layer, and, if any, other layer(s).

In the coating film, the first alternating layer preferably includes a cubic crystal structure, and the second alternating layer preferably includes a cubic crystal structure. In another aspect of the present embodiment, the first alternating layer may be constituted of a cubic crystal structure, and the second alternating layer may be constituted of a cubic crystal structure. Accordingly, the hardness of the coating film can be improved. When the whole or part of each of the first alternating layer and the second alternating layer is amorphous, the hardness is decreased, with the result that the life of the surface-coated cutting tool tends to be short. The inclusion of the cubic crystal structure in each of the first alternating layer and the second alternating layer can be confirmed by performing X-ray diffraction measurement (XRD measurement) and analysis thereof, for example. The X-ray diffraction measurement (XRD measurement) is performed onto any three points in the first alternating layer or the second alternating layer. Examples of an apparatus used for the X-ray diffraction measurement include "Smart Lab" (trademark) provided by Rigaku, and the like.

The entire thickness of the coating film can be adjusted by adjusting a film formation time appropriately. Moreover, the expression "thickness of the coating film" in the present specification is intended to mean an average thickness of the coating film. The thickness of the coating film can be measured, for example, by forming the coating film on the base material, cutting it at an appropriate position, and observing a cross section thereof using a scanning electron microscope (SEM), a transmission electron microscope (TEM), a scanning transmission electron microscope (STEM), or the like. A sample for the cross sectional observation can be produced using, for example, a focused ion beam system (FIB), a cross section polisher (CP), or the like. For example, cross sections are obtained at ten positions of the coating film, respective thicknesses in the cross sections are measured, and an average value of the measured values can be employed as the "thickness of the coating film". Further, the composition of the elements of the coating film can be measured using an energy dispersive X-ray spectroscopy (EDX) apparatus provided with an SEM or TEM. The below-described thicknesses and compositions of the A to D layers can be measured using a method similar to the above-described method.

<<First Alternating Layer (Lower Layer, Wear-Resistant Layer)>>

As shown in FIG. 1, first alternating layer 112 includes the A and B layers as described above. The one or plurality of the A layers and the one or plurality of the B layers are layered alternately. The number of layers (total number of the A and B layers) is not particularly limited as long as the one or plurality of the A layers and the one or plurality of the B layers are alternately layered. The number of layers is preferably 10 to 10000, is more preferably 10 to 5000, and is further preferably 20 to 500, for example. That is, when the A layer and the B layer are assumed as one repetition unit, the number of the repetition units in the first alternating layer is preferably 5 to 5000, is more preferably 5 to 2500, and is further preferably 10 to 250.

Each of the A layers in the first alternating layer preferably has a thickness $\lambda a$ of more than or equal to 0.005 µm and less than or equal to 2 µm. Each of the B layers in the first alternating layer preferably has a thickness $\lambda b$ of more than or equal to 0.002 µm and less than or equal to 2 µm. Particularly, it is preferable that thickness $\lambda a$ of the A layer in the first alternating layer is more than or equal to 0.005 µm and less than or equal to 2 µm and thickness $\lambda b$ of the B layer in the first alternating layer is more than or equal to 0.002 µm and less than or equal to 2 µm. It should be noted that when two or more A layers and two or more B layers are layered, thickness $\lambda a$ of each A layer and thickness $\lambda b$ of each B layer can be determined by cross-section observation with a TEM, for example. When thickness $\lambda a$ of the A layer is less than 0.005 µm and thickness $\lambda b$ of the B layer is less than 0.002 µm, the layers are mixed, with the result that the effect of alternately layering the A and B layers tends to be less likely to be obtained. On the other hand, when each of thickness $\lambda a$ of the A layer and thickness $\lambda b$ of the B layer is more than 2 µm, the effect of suppressing development of cracks in the first alternating layer tends to be less likely to be obtained.

In order to increase the wear resistance and oxidation resistance of the first alternating layer, thickness $\lambda a$ of the A layer in the first alternating layer is preferably more than or equal to 0.005 µm and less than or equal to 0.5 µm. From the same purpose, thickness $\lambda b$ of the B layer in the first alternating layer is preferably more than or equal to 0.005 µm and less than or equal to 0.5 µm. Particularly, it is more preferable that thickness $\lambda a$ of the A layer in the first alternating layer is more than or equal to 0.005 µm and less than or equal to 0.5 µm and thickness $\lambda b$ of the B layer in the first alternating layer is more than or equal to 0.005 µm and less than or equal to 0.5 µm.

Further, $\lambda a/\lambda b$, which is a ratio of the thickness of the A layer in the first alternating layer and the thickness of the B layer in the first alternating layer, preferably satisfies $1 \leq \lambda a/\lambda b \leq 5$. When $\lambda a/\lambda b$ is less than 1, the oxidation resistance of the coating film tends to be decreased. On the other hand, when $\lambda a/\lambda b$ is more than 5, the effect of suppressing development of cracks by alternately layering the A and B layers tends to be less likely to be obtained. In order to increase the wear resistance and oxidation resistance of the first alternating layer, $\lambda a/\lambda b$ more preferably satisfies $1 \leq \lambda a/\lambda b \leq 4$.

Preferably in the one form of the present embodiment, the A layer in the first alternating layer has a thickness $\lambda a$ of more than or equal to 0.005 μm and less than or equal to 2 μm, the B layer in the first alternating layer has a thickness $\lambda b$ of more than or equal to 0.002 μm and less than or equal to 2 μm, and ratio $\lambda a/\lambda b$ of the thickness of the A layer in the first alternating layer and the thickness of the B layer in the first alternating layer satisfies $1 \leq \lambda a/\lambda b \leq 5$. More preferably, the A layer in the first alternating layer has a thickness $\lambda a$ of more than or equal to 0.005 μm and less than or equal to 0.5 μm, the B layer in the first alternating layer has a thickness $\lambda b$ of more than or equal to 0.005 μm and less than or equal to 0.5 μm, and ratio $\lambda a/\lambda b$ of the thickness of the A layer in the first alternating layer and the thickness of the B layer in the first alternating layer satisfies $1 \leq \lambda a/\lambda b \leq 4$.

(A Layer)

The A layer is composed of a nitride or carbonitride of $Al_a Cr_b M1_{(1-a-b)}$, and respective atomic ratios of the metal atoms in the A layer satisfy $0.5 \leq a \leq 0.9$, $0 \leq b \leq 0.4$, and $0 \leq (1-a-b) \leq 0.1$. Since Al is included, oxidation resistance is improved in the A layer. Since the A layer is a nitride or carbonitride, the following effects are obtained: the hardness of the film becomes high and the wear resistance is improved; the coefficient of friction with a workpiece becomes small to improve the welding resistance; and the like.

Since the A layer includes Al (aluminum) and Cr (chromium), the oxidation resistance is improved. Further, due to the combination of Al and Cr, the A layer has a cubic crystal structure, thus attaining high hardness.

Particularly, atomic ratio b of Cr in the A layer is more than 0 and less than or equal to 0.4. Atomic ratio b of Cr needs to be larger than 0 in order to attain high hardness of the A layer by way of the combination of Al and Cr. On the other hand, when atomic ratio b of Cr is more than 0.4, the hardness of the A layer tends to be decreased. In order to further improve the hardness and oxidation resistance of the A layer, atomic ratio b of Cr is preferably more than or equal to 0.2 and less than or equal to 0.35 ($0.2 \leq b \leq 0.35$).

Furthermore, atomic ratio a of Al in the A layer is more than or equal to 0.5 and less than or equal to 0.9. When atomic ratio a of Al is less than 0.5, the oxidation resistance of the coating film tends to be decreased. On the other hand, when atomic ratio a of Al is more than 0.9, the hardness tends to be decreased and the wear tends to be promoted. In order to further improve the hardness and oxidation resistance of the A layer, atomic ratio a of Al is more preferably more than or equal to 0.56 and less than or equal to 0.7 ($0.56 \leq a \leq 0.7$).

M1 is one or more elements selected from a group consisting of Si (silicon) and B (boron). With such element(s), the heat resistance, film hardness, and welding resistance of the A layer are improved. It should be noted that when M1 is Si and B, an atomic ratio of a total of Si and B in the A layer is the atomic ratio (1-a-b) of M1.

It should be noted that B (boron) is normally regarded as a semimetal exhibiting an intermediate characteristic between a metallic element and a nonmetallic element; however, in the present embodiment, an element having a free electron is assumed to be a metal and boron is regarded as a metal element.

(B Layer)

The B layer is composed of a nitride or carbonitride of $Al_c Ti_d M2_{(1-c-d)}$, and respective atomic ratios of the metal atoms in the B layer satisfy $0.3 \leq c \leq 0.7$, $0.3 \leq d \leq 0.7$, and $0 \leq (1-c-d) \leq 0.1$. Since the B layer is a nitride or carbonitride, the following effects are obtained: the hardness of the film becomes high and the wear resistance is improved; the coefficient of friction with a workpiece becomes small to improve the welding resistance; and the like.

Since the B layer includes Al and Ti, the wear resistance is improved. Further, since Al and Ti are combined in the B layer, the following effect is obtained: the oxidation resistance is more improved as an amount of addition of Al is increased.

Particularly, atomic ratio c of Al in the B layer is more than or equal to 0.3 and less than or equal to 0.7. When atomic ratio c of Al is less than 0.3, the oxidation resistance of the coating film tends to be decreased. On the other hand, when atomic ratio c of Al is more than 0.7, the hardness of the B layer tends to be decreased and the wear tends to be promoted. In order to further improve the wear resistance and oxidation resistance of the B layer, atomic ratio c of Al is more preferably more than or equal to 0.35 and less than or equal to 0.7 ($0.35 \leq c \leq 0.7$), and is further preferably more than or equal to 0.4 and less than or equal to 0.65 ($0.4 \leq c \leq 0.65$).

Furthermore, atomic ratio d of Ti in the B layer is more than or equal to 0.3 and less than or equal to 0.7. When atomic ratio d of Ti is less than 0.3, the hardness tends to be decreased and the wear tends to be promoted. On the other hand, when atomic ratio d of Ti is more than 0.7, the amount of addition of Al of the coating film is decreased relatively, with the result that the oxidation resistance tends to be decreased. In order to further improve the wear resistance and oxidation resistance of the B layer, atomic ratio d of Ti is more preferably more than or equal to 0.4 and less than or equal to 0.6 ($0.4 \leq d \leq 0.6$).

M2 is one or more elements selected from a group consisting of Si and B. With such element(s), the heat resistance, film hardness, and welding resistance of the B layer are improved. It should be noted that when M2 is Si and B, an atomic ratio of a total of Si and B in the B layer is the atomic ratio (1-c-d) of M2. M1 and M2 are the same or different. That is, M1 and M2 may be the same element or may be different elements. In other words, each of M1 and M2 is independently one or more elements selected from a group consisting of Si and B.

In the first alternating layer, the lowermost layer is preferably the A layer or the B layer. When the lowermost layer is the A layer or the B layer, adhesion of the entire film becomes uniform, thus suppressing detachment at an interface between the coating film and the base material. When the lowermost layer is the A layer, oxidation from the interface between the base material and the coating film can be suppressed even if the base material is exposed as a result of development of wear. Further, when the lowermost layer is the B layer, the B layer tends to have small stress, whereby the detachment resistance of the coating film tends to be remarkably improved particularly in the case of intermittent processing that involves repeated application of load on the cutting edge, such as milling or end milling.

In the first alternating layer, the uppermost layer is preferably the B layer. Since the uppermost layer is the B layer, the adhesion between the first alternating layer and the second alternating layer can be stronger as described later.

Further, both or one of the lowermost layer and the uppermost layer in the first alternating layer may be mixed layer(s) composed of a compound in which the composition of the compound of the A layer and the composition of the compound of the B layer are mixed. That is, the lowermost layer of the first alternating layer may be such a mixed layer. Likewise, the uppermost layer of the first alternating layer may be such a mixed layer. It should be noted that when the first alternating layer includes the mixed layer(s), the number of layers described above is intended to mean the total number of the A layers, the B layers, and the mixed layer(s). The mixed layer is composed of elements included in the A and B layers. Examples of the composition of the mixed layer include TiAlCrN, TiAlCrCN, TiAlCrC, TiAlCrSiN, TiAlCrSiCN, TiAlCrSiC, TiAlCrBSiN, TiAlCrBSiCN, TiAlCrBSiC, and the like.

The thickness of the mixed layer is preferably more than or equal to 0.002 µm and less than or equal to 2 µm, and is more preferably more than or equal to 0.005 µm and less than or equal to 0.5 µm.

<<Second Alternating Layer (Upper Layer, Heat-Resistant Layer)>>

As shown in FIG. 1, second alternating layer 113 is provided on first alternating layer 112. In other words, second alternating layer 113 is provided on a side of first alternating layer 112 opposite to the base material side. Heat generated during cutting is normally transferred from the surface of the coating film to the cutting tool. Hence, by forming the second alternating layer serving as a heat-resistant layer on first alternating layer 112, the heat can be suppressed from being transferred to the whole of the coating film during cutting. Second alternating layer 113 includes the C and D layers. The one or plurality of the C layers and the one or plurality of the D layers are layered alternately. The number of layers (total number of the C and D layers) is not particularly limited as long as the one or plurality of the C layers and the one or plurality of the D layers are alternately layered. The number of layers is preferably 10 to 10000, is more preferably 10 to 5000, and is further preferably 20 to 500, for example. That is, when the C layer and the D layer are assumed as one repetition unit, the number of the repetition units in the second alternating layer is preferably 5 to 5000, is more preferably 5 to 2500, and is further preferably 10 to 250. Since the second alternating layer has such a layered structure (preferably, super-multilayer structure), the second alternating layer can be suppressed from being broken greatly during cutting. That is, since the second alternating layer has such a layered structure (preferably, super-multilayer structure), the chipping resistance can be improved, which leads to an improved cutting life.

Each of the C layers in the second alternating layer preferably has a thickness of more than or equal to 0.005 µm and less than or equal to 2 µm. Each of the D layers in the second alternating layer preferably has a thickness $\lambda d$ of more than or equal to 0.001 µm and less than or equal to 2 µm. Particularly, it is preferable that thickness $\lambda c$ of the C layer in the second alternating layer is more than or equal to 0.005 µm and less than or equal to 2 µm and thickness $\lambda d$ of the D layer in the second alternating layer is more than or equal to 0.001 µm and less than or equal to 2 µm. It should be noted that when two or more C layers and two or more D layers are layered, thickness $\lambda c$ of each C layer and thickness $\lambda d$ of each D layer can be determined in the same manner as the determination of thickness $\lambda a$ of the A layer and thickness $\lambda b$ of the B layer. When thickness $\lambda c$ of the C layer is less than 0.005 µm and thickness $\lambda d$ of the D layer is less than 0.001 µm, the layers are mixed, with the result that the effect of alternately layering the C and D layers tends to be less likely to be obtained. On the other hand, when each of thickness $\lambda c$ of the C layer and thickness $\lambda d$ of the D layer is more than 2 µm, the effect of suppressing development of cracks in the second alternating layer tends to be less likely to be obtained.

In order to increase the wear resistance and crack development resistance of the second alternating layer, thickness $\lambda c$ of the C layer in the second alternating layer is preferably more than or equal to 0.005 µm and less than or equal to 0.5 µm. For the same purpose, thickness $\lambda d$ of the D layer in the second alternating layer is preferably more than or equal to 0.005 µm and less than or equal to 0.5 µm. Particularly, it is more preferable that thickness $\lambda c$ of the C layer in the second alternating layer is more than or equal to 0.005 µm and less than or equal to 0.5 µm and thickness $\lambda d$ of the D layer in the second alternating layer is more than or equal to 0.005 µm and less than or equal to 0.5 µm.

Further, $\lambda c/\lambda d$, which is a ratio of the thickness of the C layer in the second alternating layer and the thickness of the D layer in the second alternating layer, preferably satisfies $1 \geq \lambda c/\lambda d \geq 5$. In both of a case where $\lambda c/\lambda d$ is less than 1 and a case where $\lambda c/\lambda d$ is more than 5, the effect of suppressing development of cracks in the second alternating layer tends to be less likely to be obtained. In order to improve the crack development resistance of the second alternating layer, $\lambda c/\lambda d$ more preferably satisfies $1 \leq \lambda c/\lambda d \leq 4$.

Preferably in one form of the present embodiment, the C layer in the second alternating layer has a thickness $\lambda c$ of more than or equal to 0.005 µm and less than or equal to 2 µm, the D layer in the second alternating layer has a thickness $\lambda d$ of more than or equal to 0.001 µm and less than or equal to 2 µm, and ratio $\lambda c/\lambda d$ of the thickness of the C layer in the second alternating layer and the thickness of the D layer in the second alternating layer satisfies $1 \leq \lambda c/\lambda d \leq 5$. More preferably, the C layer in the second alternating layer has a thickness $\lambda c$ of more than or equal to 0.005 µm and less than or equal to 0.5 µm, the D layer in the second alternating layer has a thickness $\lambda d$ of more than or equal to 0.005 µm and less than or equal to 0.5 µm, and ratio $\lambda c/\lambda d$ of the thickness of the C layer in the second alternating layer and the thickness of the D layer in the second alternating layer satisfies $1 \leq \lambda c/\lambda d \leq 4$.

(C Layer)

The C layer is composed of a nitride or carbonitride of $Ti_e Si_f M3_{(1-e-f)}$, and respective atomic ratios of the metal atoms in the C layer satisfy $0.75 \leq e \leq 0.99$, $0.01 \leq f \leq 0.2$, and $0 \leq (1-e-f) \leq 0.1$. Since the C layer is a nitride or carbonitride, the following effects are obtained: the hardness of the film becomes high and the wear resistance is improved; the coefficient of friction with a workpiece becomes small to improve the welding resistance; and the like.

Since the C layer includes Ti and Si, the wear resistance and heat resistance are improved. Further, since Ti and Si are combined in the C layer, the following effect is obtained: the wear resistance is more improved as an amount of addition of Ti is increased.

Particularly, atomic ratio e of Ti in the C layer is more than or equal to 0.75 and less than or equal to 0.99. When atomic ratio e of Ti is less than 0.75, the wear resistance of the coating film tends to be decreased. On the other hand, when atomic ratio e of Ti is more than 0.99, the hardness of the C layer tends to be decreased and the wear tends to be promoted. In order to more increase the wear resistance and heat resistance of the C layer, atomic ratio e of Ti is more preferably more than or equal to 0.8 and less than or equal to 0.95 ($0.8 \leq e \leq 0.95$), and is further preferably more than or equal to 0.85 and less than or equal to 0.95 ($0.85 \leq e \leq 0.95$).

Furthermore, atomic ratio f of Si in the C layer is more than or equal to 0.01 and less than or equal to 0.2. When atomic ratio f of Si is less than 0.01, the heat resistance tends to be decreased. On the other hand, when atomic ratio f of Si is more than 0.2, the amount of addition of Ti of the coating film is decreased relatively, with the result that the wear resistance tends to be decreased. In order to further improve the wear resistance and heat resistance of the C layer, atomic ratio f of Si is more preferably more than or equal to 0.05 and less than or equal to 0.15 (0.05≤f≤0.15).

M3 is one or more elements selected from a group consisting of Ta and B. With such element(s), the heat resistance, film hardness, and welding resistance of the C layer are improved. It should be noted that when M3 is Ta and B, an atomic ratio of a total of Ta and B in the C layer is the atomic ratio (1-e-f) of M3. M1 to M3 are the same or different. Namely, M1, M2 and M3 may be the same element or different elements. However, in order to increase the adhesion between the first alternating layer and the second alternating layer, M2 and M3 are preferably the same.

(D Layer)

The D layer is composed of a nitride or carbonitride of $Ti_gSi_hM4_{(1-g-h)}$, and respective atomic ratios of the metal atoms in the D layer satisfy 0.8≤g≤0.99, 0.01≤h≤0.2, and 0≤(1-g-h)≤0.1. Since the D layer is a nitride or carbonitride, the following effects are obtained: the hardness of the film becomes high and the wear resistance is improved; the coefficient of friction with a workpiece becomes small to improve the welding resistance; and the like.

Since the D layer includes Ti and Si, the wear resistance and heat resistance are improved. Further, since Ti and Si are combined in the D layer, the following effect is obtained: the wear resistance is more improved as an amount of addition of Ti is increased.

Particularly, atomic ratio g of Ti in the D layer is more than or equal to 0.8 and less than or equal to 0.99. When atomic ratio g in Ti is less than 0.8, the wear resistance of the coating film tends to be decreased. On the other hand, when atomic ratio g of Ti is more than 0.99, the hardness of the D layer tends to be decreased and the wear tends to be promoted. In order to more improve the wear resistance and heat resistance of the D layer, atomic ratio g of Ti is more preferably more than or equal to 0.8 and less than or equal to 0.95 (0.8≤e≤0.95), and is further preferably more than or equal to 0.85 and less than or equal to 0.95 (0.85≤e≤0.95).

Furthermore, atomic ratio h of Si in the D layer is more than or equal to 0.01 and less than or equal to 0.2. When atomic ratio h of Si is less than 0.01, the heat resistance tends to be decreased. On the other hand, when atomic ratio h of Si is more than 0.2, the amount of addition of Ti of the coating film is decreased relatively, with the result that the wear resistance tends to be decreased. In order to further improve the wear resistance and heat resistance of the D layer, atomic ratio h of Si is more preferably more than or equal to 0.05 and less than or equal to 0.15 (0.05≤f≤0.15).

M4 is one or more elements selected from a group consisting of Ta and B. With such element(s), the heat resistance, film hardness, and welding resistance of the D layer are improved. It should be noted that when M4 is Ta and B, an atomic ratio of a total of Ta and B in the D layer is the atomic ratio (1-g-h) of M4. M1 to M4 are the same or different. Namely, M1, M2, M3, and M4 may be the same element or different elements. In one aspect of the present embodiment, each of M3 and M4 is independently one or more elements selected from the group consisting of Ta and B. However, in order to increase the adhesion between the C layer and the D layer, M3 and M4 are preferably the same.

Here, in the present embodiment, the C and D layers each serving as a unit layer of the heat-resistant layer are intentionally configured to have very similar constituent elements and composition ratios. Accordingly, the heat-resistant layer (second alternating layer) is observed as if it macroscopically had a single composition.

However, atomic ratio e of Ti in the C layer and atomic ratio g of Ti in the D layer satisfy 0.05≤|g-e|≤0.2, and atomic ratio f of Si in the C layer and atomic ratio h of Si in the D layer satisfy 0.05≤|h-f|≤0.2. Accordingly, at least the respective composition ratios of the C layer and the D layer do not become the same. Accordingly, microscopically, two types of streak portions or laminar portions are observed (not shown), whereby the C layer can be distinguished from the D layer. Particularly, from a microphotograph, it is understood that there is an interface (plane having a slight strain not so large as to be a dislocation) between the C layer and the D layer to distinguish between the C layer and the D layer.

Since the second alternating layer (heat-resistant layer) has this interface, a crack can be suppressed from being propagated between the C layer and the D layer when the crack is generated in the coating film. Further, since the constituent elements and composition ratios of the C layer and the D layer are very similar, a crystal lattice can be continuous between the C layer and the D layer. Accordingly, the C layer and the D layer can have strong adhesion.

Figure 2:
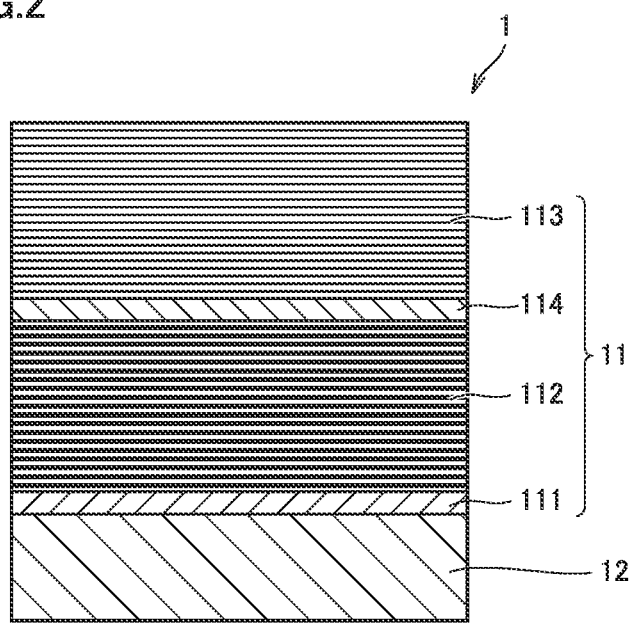
FIG. 2 is a schematic cross sectional view of a surface-coated cutting tool in another form of the present embodiment.

In the present embodiment, the coating film may further include an intermediate layer between the first alternating layer and the second alternating layer. Moreover, the coating film may further include an adhesion layer between the base material and the first alternating layer. FIG. 2 is a schematic cross sectional view of a surface-coated cutting tool in another form of the present embodiment. Coating film 11 in FIG. 2 has an adhesion layer 111 between base material 12 and first alternating layer 112. Moreover, coating film 11 has an intermediate layer 114 between first alternating layer 112 and second alternating layer 113. In one aspect of the present embodiment, the following case is not excluded: intermediate layer 114 and other layer(s) are provided between first alternating layer 112 and second alternating layer 113. In another aspect of the present embodiment, intermediate layer 114 is preferably provided in contact with first alternating layer 112 and second alternating layer 113. Hereinafter, intermediate layer 114 and adhesion layer 111 will be described.

≤≤Intermediate Layer>>

The intermediate layer is preferably an alternating layer of the A and C layers, an alternating layer of the A and D layers, an alternating layer of the B and C layers, or an alternating layer of the B and D layers. Since the coating film includes such an intermediate layer, adhesion between the first alternating layer and the second alternating layer is improved, whereby the coating film can be suppressed from being detached during intermittent processing or the like. Here, for example, the expression "alternating layer of the A and C layers" is intended to mean a layer having a multilayer structure in which one or a plurality of the A layers and one or a plurality of the C layers are alternately layered. The same applies to the "alternating layer of the A and D layers", the "alternating layer of the B and C layers", and the "alternating layer of the B and D layers".

The thicknesses of each A layer, each B layer, each C layer, and each D layer in the intermediate layer are not particularly limited as long as these thicknesses respectively fall within the above-described ranges represented by λa, λb, λc and λd and the total of these thicknesses falls within a below-described thickness range of the intermediate layer.

The thickness of the intermediate layer is preferably more than or equal to 6 nm and less than or equal to 1000 nm, and is more preferably more than or equal to 10 nm and less than or equal to 1000 nm. When the thickness of the intermediate layer is less than 6 nm, a desired adhesion effect tends to be less likely to be obtained. When the thickness of the intermediate layer is more than 1000 nm, residual stress in the intermediate layer becomes large, with the result that detachment tends to be more likely to occur. The thickness of the intermediate layer can be measured by the above-described method using a SEM, a TEM, or the like.

≪Adhesion Layer≫

Coating film 11 may further include an adhesion layer 111 between base material 12 and first alternating layer 112. More preferably, adhesion layer 111 is in contact with first alternating layer 112 and base material 12 in coating film 11. Since coating film 11 includes adhesion layer 111, coating film 11 is prevented from being detached from base material 12, thereby stabilizing the life of surface-coated cutting tool 1.

The thickness of the adhesion layer is preferably more than or equal to 0.5 nm and less than or equal to 20 nm. When the thickness of the adhesion layer is less than 0.5 nm, sufficient adhesion force tends to be less likely to be obtained because the thickness is too thin. When the thickness of the adhesion layer is more than 20 nm, residual stress in the adhesion layer is increased, with the result that detachment tends to be more likely to occur. The thickness of the adhesion layer is more preferably more than or equal to 0.5 nm and less than or equal to 10 nm, and is further preferably more than or equal to 2 nm and less than or equal to 6 nm. The thickness of the adhesion layer can also be measured by a TEM, a STEM, or the like. The thickness of the adhesion layer may be measured by obtaining cross-sectional samples of the adhesion layer in the same manner as in the measurement of the thickness of the coating film. A sample for cross-sectional observation can be obtained in the same manner as in the measurement of the thickness of the coating film. The thickness of the adhesion layer is an average thickness and is an average value of measured values.

The adhesion layer preferably includes a carbide, nitride, or carbonitride including one or more first elements, one or more second elements, and one or more third elements, the one or more first elements being selected from a group consisting of Cr, Ti, Zr and Nb, the one or more second elements being selected from elements of the base material, the one or more third elements being selected from the elements of the first alternating layer or the second alternating layer. Here, the "first element(s)" represents a concept that is not limited to one element and that includes a plurality of elements. The same applies to the "second element(s)" and the "third element(s)". Moreover, the first element(s), the second element(s), and the third element(s) have different constituent elements.

The first element(s) preferably include one or more elements selected from the group consisting of Cr, Ti, Zr, and Nb.

The second element(s) preferably include one or more elements selected from the elements of the base material. Examples of the one or more elements selected from the group consisting of the elements of the base material include one or more elements selected from a group consisting of W, Co, Ti, Ta, and Nb. The second element(s) preferably at least include W. It should be noted that the present inventors consider that W included in the second element(s) has been moved from the base material to the adhesion layer by diffusion.

The third element(s) preferably include one or more elements selected from the elements of the first alternating layer or the second alternating layer. Examples of the elements of the first alternating layer or the second alternating layer include one or more elements selected from a group consisting of Al, Cr, Ti, Si, B, and Ta.

Since the adhesion layer is composed of a carbide, nitride, or carbonitride, the adhesion is improved significantly. Further, when the adhesion layer includes W, which is one of the elements of the base material (i.e., when W included in the base material is diffused in the adhesion layer), the adhesion between the base material and the adhesion layer can be improved further.

For example, in the surface-coated cutting tool according to the present embodiment, the base material preferably includes: hard particles including WC; and a binder phase for binding the hard particles to each other. The binder phase preferably includes Co. Particularly, the adhesion layer preferably includes a carbide, nitride, or carbonitride including W, Cr, Ti, Al, and M5. Further, the adhesion layer is more preferably composed of a carbide, nitride, or carbonitride including W, Cr, Ti, Al, and M5. M5 is preferably one or more elements selected from a group consisting of a group 4 element (zirconium (Zr), hafnium (Hf) or the like), a group 5 element (vanadium (V), niobium (Nb), tantalum (Ta) or the like), a group 6 element (molybdenum (Mo) or the like) except W, Cr, and Ti in the periodic table, Si and B. Specifically, M5 is more preferably one of Si, B, Zr, V, Nb, and Ta.

Specifically, the adhesion layer is desirably composed of a compound containing an element having a chemical compatibility with both the base material and the first alternating layer, and can be a carbide, nitride, or carbonitride including an element (for example, W or C in the case of a cemented carbide) of the base material and an element (Cr, Ti, Al, Si, B, N, or the like) of the first alternating layer. Particularly, since such a carbide, nitride, or carbonitride includes one or more elements selected from the group consisting of Cr, Ti, Zr, and Nb, the adhesion can be improved significantly, thereby more stabilizing the life of the surface-coated cutting tool. The thickness, constituent elements, and composition ratio of the adhesion layer can be measured by an EDX provided with an SEM or TEM. It is suggested that when the adhesion layer having such a composition is formed, crystal lattice is continuous at each of an interface between the first alternating layer and the adhesion layer and an interface between the adhesion layer and the base material, thus resulting in improved adhesion.

Hereinafter, specific examples of the carbide, nitride, or carbonitride of the adhesion layer include below-described [a] to [1]. The adhesion layer can include one or more of these compounds.

[a] a carbide, nitride, or carbonitride including Ti and W (for example, WTiC, WTiN, WTiCN, or the like);

[b] a carbide, nitride, or carbonitride including Cr and W (for example, WCrC, WCrN, WCrCN, or the like);

[c] a carbide, nitride, or carbonitride including Ti, Cr, and W (for example, WCrTiC, WCrTiN, WCrTiCN, or the like);

[d] a carbide, nitride, or carbonitride including Ti, Al, and W (for example, WTiAlC, WTiAlN, WTiAlCN, or the like);

[e] a carbide, nitride, or carbonitride including Ti, Si, and W (for example, WTiSiC, WTiSiN, WTiSiCN, or the like);

[f] a carbide, nitride, or carbonitride including Ti, Cr, Al, and W (for example, WCrTiAlC, WCrTiAlN, WCrTiAlCN, or the like);

[g] a carbide, nitride, or carbonitride including Ti, Cr, Si, and W (for example, WCrTiSiC, WCrTiSiN, WCrTiSiCN, or the like);

[h] a carbide, nitride, or carbonitride including Ti, Al, Si, and W (for example, WTiAlSiC, WTiAlSiN, WTiAlSiCN, or the like);

[i] a carbide, nitride, or carbonitride including Ti, Cr, Al, Si, and W (for example, WCrTiAlSiC, WCrTiAlSiN, WCrTiAlSiCN, or the like); and

[j] a carbide, nitride, or carbonitride including Ti, Cr, Al, B, and W (for example, WCrTiAlBC, WCrTiAlBN, WCrTiAlBCN, or the like);

[k] a carbide, nitride, or carbonitride including Ti, Cr, Al, B, Si, and W (for example, WCrTiAlBSiC, WCrTiAlBSiN, WCrTiAlBSiCN, or the like); and

[l] a compound in which the whole or part of Cr is replaced with one or more elements selected from Ti, Zr, and Nb in each of [a] to [k] above.

≤Method for Manufacturing Surface-Coated Cutting Tool>

A method for manufacturing a surface-coated cutting tool according to the present embodiment is a method for manufacturing the above-described surface-coated cutting tool, the method including:

the step (hereinafter, also referred to as "first step") of preparing the base material; and the step (hereinafter, also referred to as "second step") of forming the first alternating layer by using a physical vapor deposition method to alternately layer the one or plurality of the A layers and the one or plurality of the B layers on the base material; and the step (hereinafter, also referred to as "third step") of forming the second alternating layer by using the physical vapor deposition method to alternately layer the one or plurality of the C layers and the one or plurality of the D layers on the first alternating layer.

In the method for manufacturing the surface-coated cutting tool, a coating film having wear resistance is intended to be formed on the surface of the base material, so that it is desirable to form a layer composed of a compound having high crystallinity. In order to develop such a coating film, the present inventors studied various film formation techniques. As a result, it was appropriate to use a physical vapor deposition method as means for developing such a coating film. The physical vapor deposition method is a deposition method in which a source material (also referred to as "evaporation source" or "target") is vaporized using physical action, and the vaporized source material is adhered onto the base material. Particularly, the physical vapor deposition method used in the present embodiment is preferably at least one selected from a group consisting of a cathode arc ion plating method, a balanced magnetron sputtering method, and an unbalanced magnetron sputtering method. Among these, for the physical vapor deposition method used in the present embodiment, it is more preferable to employ the cathode arc ion plating method allowing for high ionization rate of the element serving as the source material. When the cathode arc ion plating method is used, a metal ion bombardment cleaning process can be performed onto a surface of the base material before forming the coating film. Hence, a cleaning time can be reduced.

In the cathode arc ion plating method, after disposing the base material in an apparatus and disposing the target as a cathode, high current is applied to this target to cause arc discharge. Accordingly, the target is evaporated to ionize the atoms thereof to deposit them on the base material fed with negative bias voltage, thereby forming the coating film.

Further, for example, in the balanced magnetron sputtering method, the base material is disposed in the apparatus, the target is disposed on a magnetron electrode including a magnet for forming a balanced magnetic field, and high-frequency power is applied between the magnetron electrode and the base material, thereby generating gas plasma. Ions of gas resulting from the generation of this gas plasma are collided with the target, and atoms ejected from the target are ionized to be deposited on the base material, thereby forming the coating film.

In the unbalanced magnetron sputtering method, the magnetic field generated by the magnetron electrode in the balanced magnetron sputtering method is made unbalanced, thereby forming the coating film.

≤≤First Step: Step of Preparing Base Material>>

In the first step, the base material is prepared. For example, a cemented carbide base material is prepared as the base material. For the cemented carbide base material, a commercially available cemented carbide base material may be used or a cemented carbide base material may be produced using a general powder metallurgy method. In the production using the general powder metallurgy method, for example, WC powder, Co powder, and the like are mixed using a ball mill or the like to obtain a powder mixture. This powder mixture is dried and then is formed into a predetermined shape, thereby obtaining a shaped body. Further, by sintering the shaped body, a WC—Co based cemented carbide (sintered material) is obtained. Next, this sintered material is subjected to a predetermined cutting edge process such as honing, thereby producing a base material composed of the WC—Co based cemented carbide. In the first step, any conventionally known base material other than the above-described base material can be prepared.

(Step of Cleaning Base Material)

Before the second step described below, a step of cleaning the base material can be performed. For example, an ion bombardment process can be performed onto the surface of the base material before forming the first alternating layer using the cathode arc ion plating method in the second step. Accordingly, for example, when the cemented carbide base material is used as the base material, a soft binder phase can be removed from the surface of the base material. Then, the adhesion layer is formed on the base material, thereby increasing a ratio of the hard particles in a portion of contact between the adhesion layer and the base material. In this case, 80% or more of an area of the base material in contact with the adhesion layer is more preferably WC.

(Step of Forming Adhesion Layer)

Further, as a result of the ion bombardment process, a precursor of the adhesion layer can be formed. Specifically, in the ion bombardment process, a target including one or more elements (first element(s)) selected from Cr, Ti, Zr, and Nb is used, thereby attaching these elements on the surface of the base material as the precursor of the adhesion layer while cleaning the surface of the base material. Then, the step of forming the first alternating layer on the surface having these elements attached thereon, i.e., the second step described below, is performed, thereby forming the adhesion layer excellent in adhesion force together with the first alternating layer. A more desirable example of the element used for the ion bombardment process and included in the adhesion layer is Cr. Since Cr is an element that can be sublimated, less melted particles (droplets) are generated during the ion bombardment process, thereby preventing the surface roughness of the base material.

For example, the first step and the subsequent step of cleaning the base material can be performed as follows. In a chamber of a film forming apparatus, a chip having an appropriate shape is disposed as the base material. For example, with reference to a film forming apparatus 2 shown in FIG. 3, base material 12 is attached to an outer surface of a base material holder 21 on a rotation table 20 rotatably disposed at the center of chamber 3. A bias power supply 42 is attached to base material holder 21.

Figure 4:
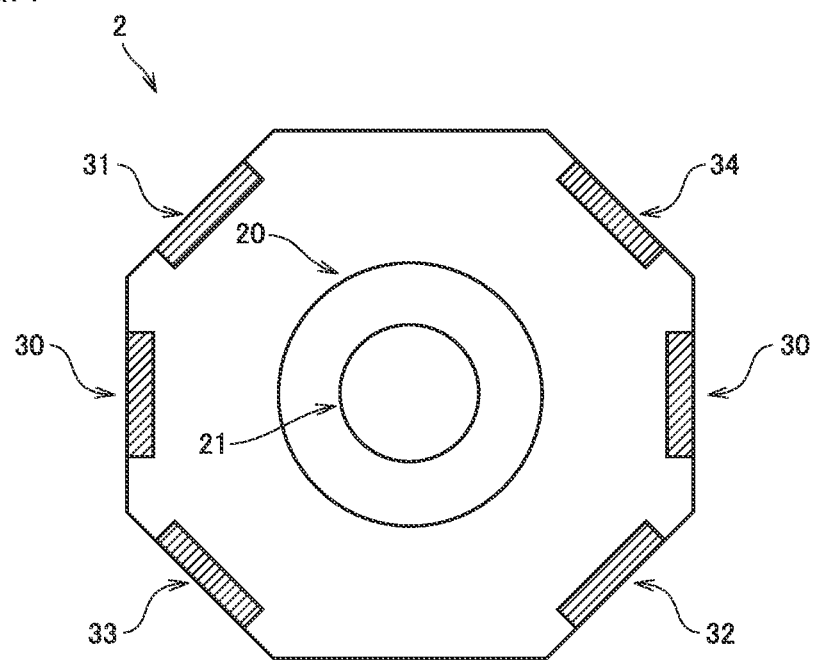
FIG. 4 is a schematic plan view of the film forming apparatus used in the method for manufacturing the surface-coated cutting tool according to the present embodiment.

Next, as shown in FIG. 4, at predetermined positions in chamber 3, alloy targets each serving as a metal source material of the coating film are correspondingly attached to an evaporation source 31 for formation of the A layer, an evaporation source 32 for formation of the B layer, an evaporation source 33 for formation of the C layer, an evaporation source 34 for formation of the D layer, and an evaporation source 30 for ion bombardment. An arc power supply 41 is attached to evaporation source 30 for ion bombardment, and respective arc power supplies (not shown) are attached to evaporation source 31 for formation of the A layer, evaporation source 32 for formation of the B layer, evaporation source 33 for formation of the C layer, and evaporation source 34 for formation of the D layer.

Chamber 3 is provided with: a gas inlet 22 for introducing atmospheric gas; and a gas outlet 23 for discharging atmospheric gas from chamber 3. From this gas outlet 23, the atmospheric gas in chamber 3 can be suctioned using a vacuum pump.

First, the pressure in chamber 3 can be reduced by the vacuum pump to $1.0\times10^{-5}$ to $1.0\times10^{-3}$ Pa and rotation table 20 is rotated, whereby the surface temperature of base material 12 is heated to 400 to 700° C. using a heater (not shown) disposed in the apparatus while rotating base material 12 of base material holder 21.

Next, argon gas is introduced as the atmospheric gas from gas inlet 22, the pressure in chamber 3 is held at 1.0 to 4.0 Pa, the voltage of bias power supply 42 is gradually increased to be −1000 to −400 V, and the surface of base material 12 is cleaned for 15 to 90 minutes (ion bombardment process with argon ions). Accordingly, when base material 12 is a cemented carbide base material, the binder phase can be removed from the surface.

Evaporation source 30 for ion bombardment is fed with an arc current of 100 to 200 A and the surface of base material 12 is subjected to the ion bombardment process for 15 to 90 minutes, thereby further cleaning the surface of base material 12 and attaching the metal element (first element) onto the surface (the step of forming the adhesion layer).

≤≤Second Step: Step of Forming First Alternating Layer>>

In the second step, the first alternating layer is formed in which the one or plurality of the A layers and the one or plurality of the B layers are layered alternately. In order to achieve this, various types of methods are used in accordance with the compositions of the A and B layers to be formed. Examples of the methods include: a method employing an alloy target having different sizes of particles such as Ti, Cr, Al and Si; a method employing a plurality of targets having different compositions; a method in which pulse voltage is employed for the bias voltage to be applied during film formation; a method in which a gas flow rate is changed during film formation; a method in which the rotation speed of the base material holder holding the base material is adjusted in the film forming apparatus; or the like. The first alternating layer can also be formed in combination with these methods.

For example, the second step can be performed as follows. Specifically, after cleaning base material 12, nitrogen is introduced as a reactive gas while rotating base material 12 at the center of chamber 3. Further, while maintaining a temperature of base material 12 to fall within a range of 400 to 700° C., a reactive gas pressure to fall within a range of 1.0 to 5.0 Pa, and a voltage of bias power supply 42 to fall within a range of −30 to −800 V, or while gradually changing them, an arc current of 100 to 200 A is supplied to each of evaporation source 31 for formation of the A layer and evaporation source 32 for formation of the B layer. Accordingly, metal ions are generated from evaporation source 31 and evaporation source 32, and supply of the arc current is stopped upon passage of a predetermined time, thereby forming the first alternating layer on the surface of base material 12. On this occasion, the first alternating layer is produced by alternately layering, one by one, the A and B layers having the above-described compositions while controlling the rotation speed of base material 12 to attain the predetermined thicknesses (λa, λb) and predetermined layer thickness ratio (λa/λb). Further, by adjusting a film formation time, the thickness of the first alternating layer is adjusted to fall within the predetermined range.

Particularly, each of the uppermost layer and lowermost layer of the first alternating layer can be produced as the A or B layer by limiting the evaporation source used when forming each layer (i.e., by designating one of evaporation source 31 for formation of the A layer and evaporation source 32 for formation of the B layer). For example, when forming the A layer as the lowermost layer, only the A layer can be formed by setting, at 0 A, the arc current of evaporation source 32 for formation of the B layer. Further, when forming both or one of the uppermost layer and lowermost layer of the first alternating layer as mixed layer(s), by increasing the rotation speed of rotation table 20, the mixed layer(s) can be produced as layer(s) in which the A and B layers are mixed.

(Step of Forming Intermediate Layer)

Before the third step described below, a step of forming the intermediate layer can be performed. For example, the step of forming the intermediate layer is performed as follows. That is, after the step of forming the first alternating layer, both or one of nitrogen and methane gas is introduced as a reactive gas with base material 12 having the first alternating layer formed thereon being rotated at the center of chamber 3. Further, while maintaining the temperature of base material 12 to fall within a range of 400 to 700° C., the reactive gas pressure to fall within a range of 1.0 to 5.0 Pa, and the voltage of bias power supply 42 to fall within a range of −30 to −800 V, or while gradually changing them, an arc current of 100 to 200 A is supplied to each of evaporation source 31 for formation of the A layer (or evaporation source 32 for formation of the B layer) and evaporation source 33 for formation of the C layer (or evaporation source 34 for formation of the D layer). Accordingly, metal ions are generated from each evaporation source, and supply of the arc current is stopped upon passage of a predetermined time, thereby forming the intermediate layer on the surface of the first alternating layer.

≤≤Third Step: Step of Forming Second Alternating Layer>>

In the third step, the second alternating layer is formed in which the one or plurality of the C layers and the one or plurality of the D layers are layered alternately. In order to achieve this, as with the second step, various types of methods are used in accordance with the compositions of the C and D layers to be formed. Examples of the methods include: a method employing an alloy target having different sizes of particles such as Ti, Ta, and Si or B; a method employing a plurality of targets having different compositions; a method in which pulse voltage is employed for the bias voltage to be applied during film formation; a method in which a gas flow rate is changed; a method in which the rotation speed of the base material holder holding the base material is adjusted in the film forming apparatus; or the like. The second alternating layer can also be formed in combination with these methods.

For example, the third step can be performed as follows. Specifically, while maintaining the temperature of base material 12, the reactive gas pressure, and the bias voltage as illustrated in the example in which the second step is performed, an arc current of 100 to 200 A is supplied to each of evaporation source 33 for formation of the C layer and evaporation source 34 for formation of the D layer, thereby generating metal ions from evaporation source 33 and evaporation source 34. Then, the supply of the arc current is stopped upon passage of a predetermined time, thereby forming the second alternating layer on the first alternating layer. On this occasion, the second alternating layer is produced by alternately layering, one by one, the C and D layers having the above-described compositions while controlling the rotation speed of base material 12 to attain the predetermined thicknesses ($\lambda c$, $\lambda d$) and predetermined layer thickness ratio ($\lambda c/\lambda d$). Further, by adjusting the film formation time, the thickness of the second alternating layer is adjusted to fall within the predetermined range. Particularly, the second alternating layer can be controlled to satisfy $0.05 \leq |g-e| \leq 0.2$ and $0.05 \leq |h-f| \leq 0.2$ by appropriately adjusting the composition of the metal source material used for each of evaporation source 33 and evaporation source 34, for example.

After forming the first alternating layer and the second alternating layer, compressive residual stress may be provided to the coating film because toughness is improved. Compressive residual stress can be provided by a blasting method, a brushing method, a barrel method, an ion implantation method, or the like, for example.

<Clauses>

The above description includes embodiments additionally described below.

(Clause 1)

A surface-coated cutting tool comprising a base material and a coating film that coats a surface of the base material, wherein the coating film includes a first alternating layer formed on the base material and a second alternating layer formed on the first alternating layer, the first alternating layer includes A and B layers, the second alternating layer includes C and D layers, one or a plurality of the A layers and one or a plurality of the B layers are layered alternately, one or a plurality of the C layers and one or a plurality of the D layers are layered alternately, each of the one or plurality of the A layers is composed of a nitride or carbonitride of $Al_aCr_bM1_{(1-a-b)}$, and respective atomic ratios of metal atoms in the A layer satisfy $0.5 \leq a \leq 0.9$, $0 \leq b \leq 0.4$, and $0 \leq (1-a-b) \leq 0.1$, each of the one or plurality of the B layers is composed of a nitride or carbonitride of $Al_cTi_dM2_{(1-c-d)}$, and respective atomic ratios of metal atoms in the B layer satisfy $0.3 \leq c \leq 0.7$, $0.3 \leq d \leq 0.7$, and $0 \leq (1-c-d) \leq 0.1$, each of the one or plurality of the C layers is composed of a nitride or carbonitride of $Ti_eSi_fM3_{(1-e-f)}$, and respective atomic ratios of metal atoms in the C layer satisfy $0.75 \leq e \leq 0.99$, $0.01 \leq f \leq 0.2$, and $0 \leq (1-e-f) \leq 0.1$, each of the one or plurality of the D layers is composed of a nitride or carbonitride of $Ti_gSi_hM4_{(1-g-h)}$, and respective atomic ratios of metal atoms in the D layer satisfy $0.8 \leq g \leq 0.99$, $0.01 \leq h \leq 0.2$, and $0 \leq (1-g-h) \leq 0.1$, the atomic ratio e of Ti in the C layer and the atomic ratio g of Ti in the D layer satisfy $0.05 \leq |g-e| \leq 0.2$, the atomic ratio f of Si in the C layer and the atomic ratio h of Si in the D layer satisfy $0.05 \leq |h-f| \leq 0.2$, each of the M1 and the M2 is independently one or more elements selected from a group consisting of Si and B, and each of the M3 and the M4 is independently one or more elements selected from a group consisting of Ta and B.

(Clause 2)

The surface-coated cutting tool according to clause 1, wherein the coating film further includes an intermediate layer between the first alternating layer and the second alternating layer, and the intermediate layer is an alternating layer of the A and C layers, an alternating layer of the A and D layers, an alternating layer of the B and C layers, or an alternating layer of the B and D layers.

(Clause 3)

The surface-coated cutting tool according to clause 1 or clause 2, wherein an uppermost layer of the first alternating layer is the B layer.

(Clause 4)

The surface-coated cutting tool according to any one of clause 1 to clause 3, wherein a lowermost layer of the first alternating layer is the A layer or the B layer.

(Clause 5)

The surface-coated cutting tool according to any one of clause 1 to clause 4, wherein the A layer has a thickness $\lambda a$ of more than or equal to 0.005 μm and less than or equal to 2 μm, the B layer has a thickness $\lambda b$ of more than or equal to 0.002 μm and less than or equal to 2 μm, and a ratio $\lambda a/\lambda b$ of the thickness of the A layer and the thickness of the B layer satisfies $1 \leq \lambda a/\lambda b \leq 5$.

(Clause 6)

The surface-coated cutting tool according to any one of clause 1 to clause 5, wherein the C layer has a thickness $\lambda c$ of more than or equal to 0.005 μm and less than or equal to 2 μm, the D layer has a thickness $\lambda d$ of more than or equal to 0.001 μm and less than or equal to 2 μm, and a ratio $\lambda c/\lambda d$ of the thickness of the C layer and the thickness of the D layer satisfies $1 \leq \lambda c/\lambda d \leq 5$.

(Clause 7)

The surface-coated cutting tool according to any one of clause 1 to clause 6, wherein the coating film has an entire thickness of more than or equal to 0.5 μm and less than or equal to 15 μm.

(Clause 8)

The surface-coated cutting tool according to any one of clause 1 to clause 7, wherein the coating film further includes an adhesion layer between the base material and the first alternating layer, the adhesion layer has a thickness of more than or equal to 0.5 nm and less than or equal to 20 nm, and the adhesion layer includes a carbide, nitride, or carbonitride including one or more first elements, one or more second elements, and one or more third elements, the one or more first elements being selected from a group consisting of Cr, Ti, Zr and Nb, the one or more second elements being selected from elements of the base material, the one or more third elements being selected from the elements of the first alternating layer or the second alternating layer.

(Clause 9)

The surface-coated tool according to clause 8, wherein the one or more second elements at least include W.

(Clause 10)

The surface-coated tool according to clause 9, wherein the base material includes hard particles containing WC and a binder phase for binding the hard particles to each other, the binder phase includes Co, the adhesion layer includes a carbide, nitride, or carbonitride including W, Cr, Ti, Al, and M5, and the M5 is one or more elements selected from a group consisting of a group 4 element, a group 5 element, a group 6 element except W, Cr, and Ti in a periodic table, Si and B.

(Clause 11)

The surface-coated cutting tool according to any one of clause 1 to clause 10, wherein the first alternating layer includes a cubic crystal structure, and the second alternating layer includes a cubic crystal structure.

Examples

While the present invention will be described in detail with reference to Examples, the present invention is not limited thereto. Here, the below-described respective thicknesses of the coating film, the A layer, the B layer, the C layer, the D layer, the first alternating layer, the second alternating layer, and the adhesion layer are values determined by the following method. That is, each of the respective thicknesses is a value determined by: using a transmission electron microscope (TEM) to observe, at ten positions, cross sections obtained by cutting the produced surface-coated cutting tool; and averaging thicknesses measured in the respective cross sections.

≤Production of Surface-Coated Cutting Tool>

Figure 3:
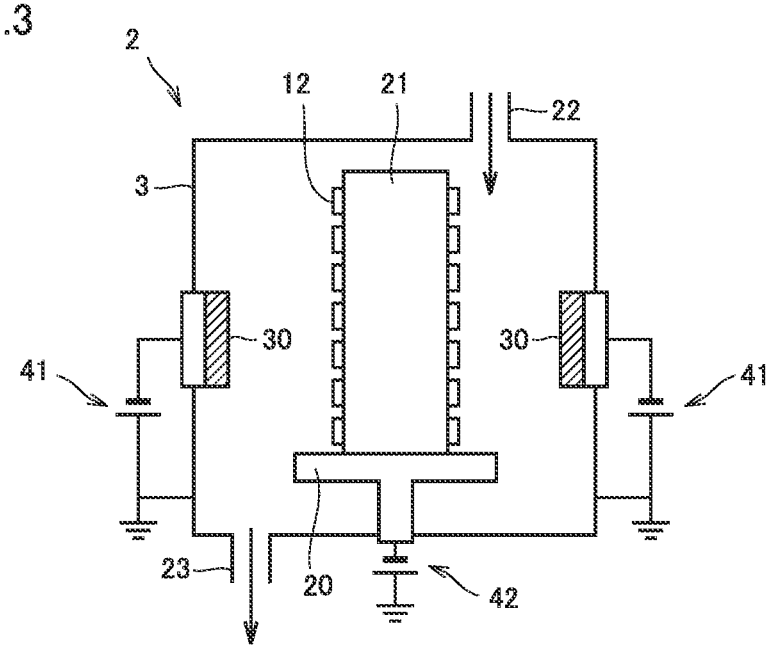
FIG. 3 is a schematic cross sectional view of a film forming apparatus used in a method for manufacturing the surface-coated cutting tool according to the present embodiment.

FIG. 3 is a schematic cross sectional view of a film forming apparatus (cathode arc ion plating apparatus) used in the present example. FIG. 4 is a schematic plan view of the film forming apparatus used in the present example.

(Step of Preparing Base Material and Step of Cleaning Base Material)

Base material 12 was prepared in chamber 3 of this film forming apparatus (step of preparing the base material). In the present example, a chip was employed as base material 12. The chip was a cemented carbide having a grade of P30 in the ISO standard and having a shape of SFKN12T3AZTN in the JIS standard. The cemented carbide of base material 12 is cemented carbide in which WC is included as hard particles and the hard particles are combined by a binder phase composed of Co. As shown in FIG. 3, base material 12 was attached to the outer surface of base material holder 21 on rotation table 20 rotatably disposed at the center of chamber 3.

As shown in FIG. 4, the following evaporation sources, each of which was an alloy target to serve as a metal source material of the coating film, were attached to chamber 3: evaporation source 31 for formation of the A layer (alloy evaporation source composed of a metal source material having a composition to constitute the A layer); evaporation source 32 for formation of the B layer (alloy evaporation source composed of a metal source material having a composition to constitute the B layer); evaporation source 33 for formation of the C layer (alloy evaporation source composed of a metal source material having a composition to constitute the C layer); and evaporation source 34 for formation of the D layer (alloy evaporation source composed of a metal source material having a composition to constitute the D layer).

As shown in FIG. 3, an arc power supply 41 was attached to evaporation source 30 for ion bombardment. Further, respective arc power supplies (not shown) were attached to evaporation source 31 for formation of the A layer, evaporation source 32 for formation of the B layer, evaporation source 33 for formation of the C layer, and evaporation source 34 for formation of the D layer.

A bias power supply 42 was attached to base material holder 21. Since gas inlet 22 for introducing atmospheric gas and gas outlet 23 for discharging the atmospheric gas from chamber 3 are provided in chamber 3, the atmospheric gas in chamber 3 can be suctioned and discharged from gas outlet 23 using a vacuum pump.

First, in the film forming apparatus shown in FIG. 3 and FIG. 4, the pressure in chamber 3 was reduced using the vacuum pump and rotation table 20 was rotated, thereby rotating base material 12 of base material holder 21. Then, the heater (not shown) disposed in the apparatus was used to heat the surface temperature of base material 12 to 500° C. and chamber 3 was vacuumed until the pressure in chamber 3 became $1.0 \times 10^{-4}$ Pa.

Next, the following process (ion bombardment process with argon ions) was performed: argon gas was introduced as atmospheric gas from gas inlet 22; the pressure in chamber 3 was held at 3.0 Pa; the voltage of bias power supply 42 was gradually increased to be −1000 V; the surface of base material 12 was cleaned; and the binder phase was removed from the surface of base material 12. Then, the argon gas was discharged from the inside of chamber 3 (step of cleaning the base material).

(Step of Forming First Alternating Layer)

In each of Examples 1 to 12, 14, and 16 to 20, after cleaning base material 12, nitrogen was introduced as a reactive gas while rotating base material 12 at the center of chamber 3. Further, while maintaining the temperature of base material 12 at 500° C., the reactive gas pressure at 2.0 Pa, and the voltage of bias power supply 42 at a certain value in a range of −30 V to −800 V, or while gradually changing them, an arc current of 100 A was supplied to each of evaporation source 31 for formation of the A layer and evaporation source 32 for formation of the B layer. Accordingly, metal ions were generated from evaporation source 31 and evaporation source 32, and supply of the arc current was stopped upon passage of a predetermined time, thereby forming, on the surface of base material 12, the first alternating layer having the composition shown in Table 1 or Table 2. On this occasion, the first alternating layer was produced by alternately layering, one by one, the A and B layers having the compositions shown in Table 1 or Table 2 while adjusting the rotation speed of base material 12 to attain the thicknesses ($\lambda a$, $\lambda b$) and layer thickness ratio ($\lambda a/\lambda b$) shown in Table 1 or Table 2. On this occasion, the number of layers (total number of the A and B layers) was 69 to 511 (Table 1 and Table 2). Moreover, when the A layer and the B layer were assumed as one repetition unit, the number of repetition units in the formed first alternating layer was 34 to 255. It should be noted that it is considered that due to an experimental error, the entire thickness of the first alternating layer calculated based on the respective thicknesses of the A and B layers and the number of layers does not coincide with the entire thickness of the first alternating layer determined using the transmission electron microscope (TEM).

In each of Examples 13 and 15, the first alternating layer was produced in the same manner as described above except that methane gas was introduced as a reactive gas in addition to nitrogen to form each of the A and B layers into a carbonitride.

Particularly, the ratio (layer thickness ratio) of the thickness of one A layer and the thickness of one B layer was adjusted to be such a ratio as described in Table 1 or Table 2 by controlling the rotation speed of rotation table 20.

Here, as shown in Table 1 or Table 2, each of the uppermost layer and the lowermost layer was constituted of a mixed layer of the A and B layers in each of Examples 1 to 5, and each of the uppermost layer and the lowermost layer was constituted of the A layer or the B layer in each of Examples 6 to 20.

In each of Comparative Examples 1 and 2, for a layer corresponding to the first alternating layer, a TiN layer was produced. In Comparative Example 3, for a layer corresponding to the first alternating layer, an A layer as shown in Table 1 was produced. In each of Comparative Examples 4 and 5, for a layer corresponding to the first alternating layer, a B layer as shown in Table 2 was produced. In Comparative Example 7, for a layer corresponding to the first alternating layer, a TiSiN layer (composition corresponding to the second alternating layer) as shown in Table 2 was produced. Each of Comparative Examples 1 to 8 is an example in which no second alternating layer is formed as described below. Comparative Example 6 was produced in the same manner as in Example 1 except that: each of the lowermost layer and the uppermost layer was constituted of the B layer; the B layer had a composition as shown in Table 2; the layer thickness ratio ($\lambda a/\lambda b$) was 5; and no second alternating layer described later was formed. Comparative Example 8 was produced in the same manner as in Example 1 except that: each of the lowermost layer and the uppermost layer was constituted of the B layer; the B layer had a composition as shown in Table 2; the layer thickness ratio ($\lambda a/\lambda b$) was 4; and one C layer was formed as a layer corresponding to the second alternating layer described later. In this way, the second step was performed.

It should be noted that in each of Examples 6 to 20, each of the uppermost and lowermost layers of the first alternating layer was produced by forming a film by using only one of two surfaces of the evaporation source for formation of the first alternating layer. The mixed layer in each of Examples 1 to 5 was produced by increasing the rotation speed of rotation table 20 to form a layer composed of a compound having a mixed composition of the compound of the A layer and the compound of the B layer.

TABLE 1

First Alternating Layer (Wear-Resistant Layer)

| | A Layer Composition $Al_aCr_bN$ | B Layer Composition $Al_cTi_dN$ | Lowermost Layer | Uppermost Layer | $\lambda a$ (µm) | $\lambda b$ (µm) | $\lambda a/\lambda b$ | Number of Layers | Entire Thickness (µm) |
|---|---|---|---|---|---|---|---|---|---|
| Example 1 | $Al_{0.70}Cr_{0.3}N$ | $Al_{0.50}Ti_{0.50}N$ | Mixed Layer | Mixed Layer | 0.06 | 0.01 | 6 | 69 | 2.4 |
| Example 2 | $Al_{0.70}Cr_{0.3}N$ | $Al_{0.60}Ti_{0.40}N$ | Mixed Layer | Mixed Layer | 0.012 | 0.002 | 6 | 343 | 2.4 |
| Example 3 | $Al_{0.70}Cr_{0.3}N$ | $Al_{0.60}Ti_{0.40}N$ | Mixed Layer | Mixed Layer | 0.06 | 0.01 | 6 | 69 | 2.4 |
| Example 4 | $Al_{0.70}Cr_{0.3}N$ | $Al_{0.60}Ti_{0.40}N$ | Mixed Layer | Mixed Layer | 0.06 | 0.01 | 6 | 69 | 2.4 |
| Example 5 | $Al_{0.70}Cr_{0.3}N$ | $Al_{0.60}Ti_{0.40}N$ | Mixed Layer | Mixed Layer | 0.012 | 0.002 | 6 | 343 | 2.4 |
| Example 6 | $Al_{0.70}Cr_{0.3}N$ | $Al_{0.60}Ti_{0.40}N$ | A Layer | A Layer | 0.06 | 0.01 | 6 | 69 | 2.4 |
| Example 7 | $Al_{0.70}Cr_{0.3}N$ | $Al_{0.60}Ti_{0.40}N$ | B Layer | A Layer | 0.012 | 0.002 | 6 | 342 | 2.4 |
| Example 8 | $Al_{0.70}Cr_{0.3}N$ | $Al_{0.60}Ti_{0.40}N$ | A Layer | B Layer | 0.06 | 0.01 | 6 | 68 | 2.4 |
| Example 9 | $Al_{0.70}Cr_{0.3}N$ | $Al_{0.60}Ti_{0.40}N$ | B Layer | A Layer | 0.012 | 0.002 | 6 | 342 | 2.4 |
| Example 10 | $Al_{0.70}Cr_{0.3}N$ | $Al_{0.60}Ti_{0.40}N$ | B Layer | B Layer | 0.01 | 0.0025 | 4 | 383 | 2.4 |
| Example 11 | $Al_{0.70}Cr_{0.3}N$ | $Al_{0.60}Ti_{0.40}N$ | B Layer | A Layer | 0.012 | 0.003 | 4 | 320 | 2.4 |
| Example 12 | $Al_{0.70}Cr_{0.3}N$ | $Al_{0.60}Ti_{0.40}CN$ | B Layer | B Layer | 0.01 | 0.0025 | 4 | 383 | 2.4 |
| Example 13 | $Al_{0.70}Cr_{0.3}CN$ | $Al_{0.60}Ti_{0.40}N$ | B Layer | A Layer | 0.01 | 0.0025 | 4 | 384 | 2.4 |
| Example 14 | $Al_{0.70}Cr_{0.3}N$ | $Al_{0.60}Ti_{0.40}N$ | B Layer | B Layer | 0.012 | 0.003 | 4 | 319 | 2.4 |

TABLE 2

First Alternating Layer (Wear-Resistant Layer)

| | A Layer Composition $Al_aCr_bN$ | B Layer Composition $Al_cTi_dN$ | Lowermost Layer | Uppermost Layer | $\lambda a$ (µm) | $\lambda b$ (µm) | $\lambda a/\lambda b$ | Number of Layers | Entire Thickness (µm) |
|---|---|---|---|---|---|---|---|---|---|
| Example 15 | $Al_{0.70}Cr_{0.3}CN$ | $Al_{0.60}Ti_{0.40}CN$ | B Layer | B Layer | 0.01 | 0.0025 | 4 | 383 | 2.4 |
| Example 16 | $Al_{0.70}Cr_{0.3}N$ | $Al_{0.60}Ti_{0.40}N$ | B Layer | A Layer | 0.02 | 0.005 | 4 | 192 | 2.4 |
| Example 17 | $Al_{0.70}Cr_{0.3}N$ | $Al_{0.60}Ti_{0.40}N$ | B Layer | B Layer | 0.01 | 0.0025 | 4 | 383 | 2.4 |
| Example 18 | $Al_{0.60}Cr_{0.3}B_{0.10}N$ | $Al_{0.60}Ti_{0.30}B_{0.10}N$ | B Layer | B Layer | 0.01 | 0.0025 | 4 | 511 | 3.2 |
| Example 19 | $Al_{0.60}Cr_{0.3}Si_{0.05}N$ | $Al_{0.60}Ti_{0.35}Si_{0.05}N$ | B Layer | A Layer | 0.02 | 0.005 | 4 | 256 | 3.2 |
| Example 20 | $Al_{0.60}Cr_{0.3}B_{0.05}N$ | $Al_{0.60}Ti_{0.35}Si_{0.05}N$ | B Layer | B Layer | 0.01 | 0.0025 | 4 | 511 | 3.2 |
| Comparative Example 1 | TiN | — | — | — | 5.1 | — | — | 1 | 5.1 |
| Comparative Example 2 | TiN | — | — | — | 5.3 | — | — | 1 | 5.3 |
| Comparative Example 3 | $Al_{0.70}Cr_{0.3}N$ | — | — | — | 5.5 | — | — | 1 | 5.5 |
| Comparative Example 4 | — | $Al_{0.6}Ti_{0.4}N$ | — | — | — | 5.7 | — | 1 | 5.7 |

TABLE 2-continued

| | First Alternating Layer (Wear-Resistant Layer) | | | | | | | | |
|---|---|---|---|---|---|---|---|---|---|
| | A Layer Composition $Al_aCr_bN$ | B Layer Composition $Al_cTi_dN$ | Lowermost Layer | Uppermost Layer | λa (μm) | λb (μm) | λa/λb | Number of Layers | Entire Thickness (μm) |
| Comparative Example 5 | — | $Al_{0.6}Ti_{0.35}Si_{0.05}N$ | — | — | — | 5.6 | — | 1 | 5.6 |
| Comparative Example 6 | $Al_{070}Cr_{0.3}N$ | $Al_{0.60}Ti_{0.4}N$ | B Layer | B Layer | 0.05 | 0.01 | 5 | 177 | 5.3 |
| Comparative Example 7 | $Ti_{0.90}Si_{0.10}N$ | — | — | — | 5.1 | — | — | 1 | 5.1 |
| Comparative Example 8 | $Al_{070}Cr_{0.3}N$ | $Al_{0.60}Ti_{0.40}N$ | B Layer | B Layer | 0.06 | 0.015 | 4 | 131 | 4.9 |

(Step of Forming Second Alternating Layer)

Next, in each of Examples 1 to 13 and 18 to 20, while maintaining the temperature of base material 12, the reactive gas pressure, and the bias voltage as above, an arc current of 100 A was supplied to each of evaporation source 33 for formation of the C layer and evaporation source 34 for formation of the D layer, thereby generating metal ions from evaporation source 33 and evaporation source 34. On this occasion, nitrogen was used as the reactive gas. The supply of the arc current was stopped upon passage of a predetermined time, thereby forming, on the first alternating layer, the second alternating layer having a composition shown in Table 3 or Table 4. On this occasion, the second alternating layer was produced by alternately layering, one by one, the C and D layers having the compositions shown in Table 3 or Table 4 while adjusting the rotation speed of base material 12 to attain the thicknesses (λc, λd) and layer thickness ratio (λc/λd) shown in Table 3 or Table 4. On this occasion, the number of layers (total number of the C and D layers) was 91 to 549 (Table 3 and Table 4). Moreover, when the C layer and the D layer were assumed as one repetition unit, the number of repetition units in the formed second alternating layer was 45 to 274. It should be noted that it is considered that due to an experimental error, the entire thickness of the second alternating layer calculated based on the respective thicknesses of the C and D layers and the number of layers does not coincide with the entire thickness of the second alternating layer determined using the transmission electron microscope (TEM). In each of Examples 14 to 17, the second alternating layer was produced in the same manner as described above except that methane gas was introduced as the reactive gas in addition to nitrogen to form each of the C and D layers into a carbonitride. It should be noted that the ratio (layer thickness ratio) of the thickness of one C layer and the thickness of one D layer was adjusted to be such a ratio as described in Table 3 or Table 4 by controlling the rotation speed of rotation table 20.

Particularly, by employing a combination of metal source materials having different compositions for the C layer and the D layer, the second alternating layer was produced to satisfy $0.05 \leq |g-e| \leq 0.2$ and $0.05 \leq |h-f| \leq 0.2$.

In each of Comparative Examples 1 to 8, no second alternating layer was formed. It should be noted that in Comparative Example 8, one C layer was formed as a layer corresponding to the second alternating layer (Table 4).

TABLE 3

| | Second Alternating Layer (Heat-Resistant Layer) | | | | | | | | |
|---|---|---|---|---|---|---|---|---|---|
| | C Layer Composition $Ti_eSi_fN$ | D Layer Composition $Ti_gSi_hN$ | Relation of Amount of Ti \|g-e\| | Relation of Amount of Si \|h-f\| | λc (μm) | λd (μm) | λc/λd | Number of Layers | Entire Thickness (μm) |
| Example 1 | $Ti_{0.85}Si_{0.15}N$ | $Ti_{0.95}Si_{0.15}N$ | 0.1 | 0.1 | 0.06 | 0.01 | 6 | 91 | 3.2 |
| Example 2 | $Ti_{0.85}Si_{0.15}N$ | $Ti_{0.91}Si_{0.09}N$ | 0.06 | 0.06 | 0.012 | 0.002 | 6 | 457 | 3.2 |
| Example 3 | $Ti_{0.85}Si_{0.15}N$ | $Ti_{0.95}Si_{0.09}N$ | 0.1 | 0.1 | 0.06 | 0.01 | 6 | 94 | 3.3 |
| Example 4 | $Ti_{0.75}Si_{0.25}N$ | $Ti_{0.95}Si_{0.05}N$ | 0.2 | 0.2 | 0.012 | 0.002 | 6 | 443 | 3.1 |
| Example 5 | $Ti_{0.75}Si_{0.25}N$ | $Ti_{0.95}Si_{0.05}N$ | 0.2 | 0.2 | 0.012 | 0.002 | 6 | 443 | 3.1 |
| Example 6 | $Ti_{0.85}Si_{0.15}N$ | $Ti_{0.95}Si_{0.05}N$ | 0.1 | 0.1 | 0.012 | 0.002 | 6 | 457 | 3.2 |
| Example 7 | $Ti_{0.85}Si_{0.15}N$ | $Ti_{0.95}Si_{0.05}N$ | 0.1 | 0.1 | 0.012 | 0.002 | 6 | 457 | 3.2 |
| Example 8 | $Ti_{0.85}Si_{0.15}N$ | $Ti_{0.95}Si_{0.05}N$ | 0.1 | 0.1 | 0.06 | 0.01 | 6 | 91 | 3.2 |
| Example 9 | $Ti_{0.85}Si_{0.15}N$ | $Ti_{0.95}Si_{0.05}N$ | 0.1 | 0.1 | 0.012 | 0.002 | 6 | 457 | 3.2 |
| Example 10 | $Ti_{0.85}Si_{0.15}N$ | $Ti_{0.95}Si_{0.05}N$ | 0.1 | 0.1 | 0.01 | 0.0017 | 6 | 549 | 3.2 |
| Example 11 | $Ti_{0.85}Si_{0.15}N$ | $Ti_{0.95}Si_{0.05}N$ | 0.1 | 0.1 | 0.012 | 0.003 | 4 | 427 | 3.2 |
| Example 12 | $Ti_{0.85}Si_{0.15}N$ | $Ti_{0.95}Si_{0.05}N$ | 0.1 | 0.1 | 0.01 | 0.0025 | 4 | 512 | 3.2 |
| Example 13 | $Ti_{0.85}Si_{0.15}N$ | $Ti_{0.95}Si_{0.05}N$ | 0.1 | 0.1 | 0.012 | 0.003 | 4 | 427 | 3.2 |
| Example 14 | $Ti_{0.85}Si_{0.15}CN$ | $Ti_{0.95}Si_{0.05}CN$ | 0.1 | 0.1 | 0.012 | 0.003 | 4 | 427 | 3.2 |

TABLE 4

Second Alternating Layer (Heat-Resistant Layer)

| | C Layer Composition $Ti_eSi_fN$ | D Layer Composition $Ti_gSi_hN$ | Relation of Amount of Ti \|g-e\| | Relation of Amount of Si \|h-f\| | $\lambda c$ ($\mu m$) | $\lambda d$ ($\mu m$) | $\lambda c/\lambda d$ | Number of Layers | Entire Thickness ($\mu m$) |
|---|---|---|---|---|---|---|---|---|---|
| Example 15 | $Ti_{0.85}Si_{0.15}CN$ | $Ti_{0.95}Si_{0.05}CN$ | 0.1 | 0.1 | 0.02 | 0.005 | 4 | 256 | 3.2 |
| Example 16 | $Ti_{0.85}Si_{0.15}CN$ | $Ti_{0.95}Si_{0.05}CN$ | 0.1 | 0.1 | 0.02 | 0.005 | 4 | 256 | 3.2 |
| Example 17 | $Ti_{0.85}Si_{0.15}CN$ | $Ti_{0.95}Si_{0.05}CN$ | 0.1 | 0.1 | 0.01 | 0.0025 | 4 | 512 | 3.2 |
| Example 18 | $Ti_{0.85}Si_{0.10}B_{0.05}N$ | $Ti_{0.90}Si_{0.05}B_{0.05}N$ | 0.1 | 0.1 | 0.01 | 0.0025 | 4 | 368 | 2.3 |
| Example 19 | $Ti_{0.85}Si_{0.10}Ta_{0.05}N$ | $Ti_{0.90}Si_{0.05}Ta_{0.05}N$ | 0.1 | 0.1 | 0.02 | 0.005 | 4 | 184 | 2.3 |
| Example 20 | $Ti_{0.85}Si_{0.10}B_{0.05}N$ | $Ti_{0.90}Si_{0.05}B_{0.05}N$ | 0.1 | 0.1 | 0.01 | 0.0025 | 4 | 368 | 2.3 |
| Comparative Example 1 | — | — | — | — | — | — | — | — | — |
| Comparative Example 2 | — | — | — | — | — | — | — | — | — |
| Comparative Example 3 | — | — | — | — | — | — | — | — | — |
| Comparative Example 4 | — | — | — | — | — | — | — | — | — |
| Comparative Example 5 | — | — | — | — | — | — | — | — | — |
| Comparative Example 6 | — | — | — | — | — | — | — | — | — |
| Comparative Example 7 | — | — | — | — | — | — | — | — | — |
| Comparative Example 8 | $Ti_{0.85}Si_{0.15}N$ | — | — | — | 2.6 | — | — | 1 | 2.6 |

(Step of Forming Adhesion Layer)

Here, in each of Examples 12 to 20, after the step of cleaning the base material, an adhesion layer having composition and thickness shown in Table 5 or Table 6 was formed. In Comparative Example 2, a TiN layer having a thickness shown in Table 6 was formed as a layer corresponding to the adhesion layer.

The adhesion layer was formed by introducing both or one of nitrogen and methane as a reactive gas while rotating base material 12 at the center of chamber 3 before the step of forming the first alternating layer and after cleaning base material 12. Further, while maintaining the temperature of base material 12 at 500° C., the reactive gas pressure at 2.0 Pa, and the voltage of bias power supply 42 at a certain value in a range of –30 V to –800 V or while gradually changing them, an arc current of 100 A was supplied to an alloy target (not shown) having a composition corresponding to that of the adhesion layer. Accordingly, metal ions are generated from the alloy target. Upon passage of a predetermined time, the supply of the arc current was stopped, whereby the adhesion layer having the composition and thickness shown in Table 5 or Table 6 was formed on the surface of base material 12.

(Step of Forming Intermediate Layer)

Here, in each of Examples 5 to 20, after the step of forming the first alternating layer, the intermediate layer having the composition and thickness shown in Table 5 or Table 6 was formed. Specifically, the intermediate layer was formed by introducing, as a reactive gas, both or one of nitrogen and methane gas while rotating base material 12 having the first alternating layer formed thereon at the center of chamber 3. Further, while maintaining the temperature of base material 12 at 500° C., the reactive gas pressure at 2.0 Pa, and the voltage of bias power supply 42 at a certain value in a range of –30 V to –800 V, or while gradually changing them, an arc current of 100 A was supplied to each of evaporation source 31 for formation of the A layer (or evaporation source 32 for formation of the B layer) and evaporation source 33 for formation of the C layer (or evaporation source 33 for formation of the D layer). Accordingly, metal ions were generated from each evaporation source, and supply of the arc current is stopped upon passage of a predetermined time, thereby forming intermediate layer 114 on the surface of first alternating layer 112. Intermediate layer 114 had a multilayer structure constituted of an alternating layer having the A (or B) and C (or D) layers.

TABLE 5

| | Adhesion Layer | | Intermediate Layer | | Entire Thickness of Coating Film ($\mu m$) | Tool Life | |
|---|---|---|---|---|---|---|---|
| | | | | | | Continuous Cutting | Intermittent Cutting |
| | Average Composition | Thickness [nm] | Composition of Alternating Layer | Thickness [$\mu m$] | | Cutting Distance (m) | |
| Example 1 | — | — | None | — | 5.6 | 1050 | 840 |
| Example 2 | — | — | None | — | 5.6 | 1100 | 880 |
| Example 3 | — | — | None | — | 5.7 | 1150 | 920 |
| Example 4 | — | — | None | — | 5.5 | 1100 | 880 |
| Example 5 | — | — | A + D Layers* | 0.1 | 5.6 | 1130 | 970 |
| Example 6 | — | — | A + D Layers | 0.1 | 5.7 | 1150 | 977.5 |
| Example 7 | — | — | A + D Layers | 0.1 | 5.7 | 1150 | 977.5 |

TABLE 5-continued

| | Adhesion Layer | | Intermediate Layer | | Entire Thickness of Coating | Tool Life | |
|---|---|---|---|---|---|---|---|
| | | | | | | Continuous Cutting | Intermittent Cutting |
| | Average Composition | Thickness [nm] | Composition of Alternating Layer | Thickness [μm] | Film (μm) | Cutting Distance (m) | |
| Example 8 | — | — | A + D Layers | 0.1 | 5.7 | 1350 | 1147.5 |
| Example 9 | — | — | A + D Layers | 0.1 | 5.7 | 1350 | 1147.5 |
| Example 10 | — | — | B + C Layers** | 0.03 | 5.6 | 1550 | 1317.5 |
| Example 11 | — | — | B + C Layers | 0.03 | 5.6 | 1650 | 1320 |
| Example 12 | $W_{0.40}Cr_{0.25}Al_{0.20}Ti_{0.15}CN$ | 5 | B + C Layers | 0.03 | 5.6 | 1750 | 1300 |
| Example 13 | $W_{0.40}Cr_{0.25}Al_{0.20}Ti_{0.15}CN$ | 5 | B + C Layers | 0.03 | 5.6 | 1750 | 1300 |
| Example 14 | $W_{0.40}Cr_{0.25}Al_{0.20}Ti_{0.15}CN$ | 5 | B + C Layers | 0.03 | 5.6 | 1800 | 1300 |

*A + D Layers: alternating layer constituted of A and D layers
**B + C Layers: alternating layer constituted of B and C layers

TABLE 6

| | Adhesion Layer | | Intermediate Layer | | Entire Thickness of Coating | Tool Life | |
|---|---|---|---|---|---|---|---|
| | | | | | | Continuous Cutting | Intermittent Cutting |
| | Average Composition | Thickness [nm] | Composition of Alternating Layer | Thickness [μm] | Film (μm) | Cutting Distance (m) | |
| Example 15 | $W_{0.40}Cr_{0.25}Al_{0.20}Ti_{0.15}CN$ | 5 | B + C Layers** | 0.03 | 5.6 | 1850 | 1400 |
| Example 16 | $W_{0.40}Cr_{0.25}Al_{0.20}Ti_{0.15}C$ | 5 | B + C Layers | 0.03 | 5.6 | 1750 | 1300 |
| Example 17 | $W_{0.40}Cr_{0.25}Al_{0.20}Ti_{0.15}N$ | 5 | B + C Layers | 0.03 | 5.6 | 1750 | 1300 |
| Example 18 | $W_{0.40}Cr_{0.25}Al_{0.20}Ti_{0.10}B_{0.05}CN$ | 5 | B + C Layers | 0.03 | 5.5 | 1750 | 1300 |
| Example 19 | $W_{0.4}Cr_{0.25}Al_{0.20}Ti_{0.10}Si_{0.05}CN$ | 5 | B + C Layers | 0.03 | 5.5 | 1850 | 1450 |
| Example 20 | $W_{0.4}Cr_{0.25}Al_{0.20}Ti_{0.10}B_{0.02}Si_{0.03}CN$ | 5 | B + C Layers | 0.03 | 5.5 | 1950 | 1550 |
| Comparative Example 1 | — | — | None | — | 5.1 | 450 | 250 |
| Comparative Example 2 | TiN | 100 | None | — | 5.4 | 550 | 300 |
| Comparative Example 3 | — | — | None | — | 5.5 | 550 | 300 |
| Comparative Example 4 | — | — | None | — | 5.7 | 650 | 520 |
| Comparative Example 5 | — | — | None | — | 5.6 | 750 | 500 |
| Comparative Example 6 | — | — | None | — | 5.3 | 850 | 550 |
| Comparative Example 7 | — | — | None | — | 5.1 | 700 | 560 |
| Comparative Example 8 | — | — | None | — | 7.5 | 1000 | 800 |

**B + C Layers: alternating layer constituted of B and C layers

In the manner described above, each of the surface-coated cutting tools of Examples 1 to 20 and Comparative Examples 1 to 8 was produced. It should be noted that the entire thickness of the coating film in each of Table 5 and Table 6 includes the thickness of the intermediate layer and the thickness of the adhesion layer. However, since each of the intermediate layer and the adhesion layer is much thinner than the entire coating film, it may be described that the entire thickness of the coating film seemingly coincides with the total thickness of the entire thickness of the first alternating layer and the entire thickness of the second alternating layer.

≤Evaluation of Life of Surface-Coated Cutting Tool>
≤≤Continuous Cutting Test>>

Each of the surface-coated cutting tools of Examples 1 to 20 and Comparative Examples 1 to 8 obtained as described above was subjected to a continuous cutting test under below-described conditions. The tool life was evaluated by measuring a distance (based on m as a unit) in which cutting was performed until a flank wear width became more than 0.2 mm. Results thereof are shown in Table 5 and Table 6. It is indicated that as the value of the cutting distance is larger, the wear resistance is more excellent and the life is longer.

Continuous cutting test conditions:
Workpiece: Alloy steel
Cutting speed v (m/min): 250 m/min
Feed rate f (mm/cutting edge): 0.2 mm/cutting edge
Amount of cut ap (mm): 2.0 mm
Amount of cut as in the radial direction (mm): 50 mm.
≤≤Intermittent Cutting Test>>

Further, each of the surface-coated cutting tools of Examples 1 to 20 and Comparative Examples 1 to 8 was subjected to a dry-type intermittent cutting test under below-described conditions so as to evaluate the tool life by measuring a distance (based on m as a unit) in which cutting was performed until the cutting edge was broken. Results thereof are shown in Table 5 and Table 6. It is indicated that as the value of the cutting distance is larger, the chipping resistance is more excellent and the life is longer.

Dry type intermittent test conditions:
Workpiece: SUS316
Cutting speed v (m/min): 250 m/min
Feed rate f (mm/cutting edge): 0.23 mm/cutting edge
Amount of cut ap (mm): 2.0 mm
Amount of cut as in the radial direction (mm): 50 mm.
<<Evaluation Results>>

As shown in Table 5 and Table 6, the surface-coated cutting tool according to each of the Examples apparently had an improved tool life as compared with the surface-coated cutting tool of each of the Comparative Examples. This is presumably because the first alternating layer constituted of the A and B layers provided improved wear resistance and the second alternating layer constituted of the C and D layers provided improved heat resistance and chipping resistance. Therefore, the surface-coated cutting tool according to each of the Examples exhibits excellent chipping resistance and wear resistance. Hence, the surface-coated cutting tool according to each of the Examples can withstand severe cutting conditions and have excellent cutting edge quality.

Particularly, the tendency of improving the tool life was more strongly recognized when the lowermost layer of the first alternating layer was the A or B layer, the uppermost layer of the first alternating layer was the B layer, $\lambda a/\lambda b$ and $\lambda c/\lambda d$ fell within the predetermined ranges, and the like. Further, the tool life was improved more when the adhesion layer having the predetermined composition was included.

Heretofore, the embodiments and examples of the present invention have been illustrated, but it has been initially expected to appropriately combine the configurations of the embodiments and examples and modify them in various manners.

The embodiments and examples disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: surface-coated cutting tool; 11: coating film; 111: adhesion layer; 112: first alternating layer; 113: second alternating layer; 114: intermediate layer; 12: base material; 2: film forming apparatus; 3: chamber; 20: rotation table; 21: base material holder; 22: gas inlet; 23: gas outlet; 30: evaporation source for ion bombardment; 31: evaporation source for formation of A layer; 32: evaporation source for formation of B layer; 33: evaporation source for formation of C layer; 34: evaporation source for formation of D layer; 41: arc power supply; 42: bias power supply.

The invention claimed is:

1. A surface-coated cutting tool comprising a base material and a coating film provided on a surface of the base material, wherein
the coating film includes a first alternating layer provided on the base material and a second alternating layer provided on the first alternating layer,
the first alternating layer includes A and B layers,
the second alternating layer includes C and D layers,
one or a plurality of the A layers and one or a plurality of the B layers are layered alternately,
one or a plurality of the C layers and one or a plurality of the D layers are layered alternately,
each of the one or plurality of the A layers is composed of a nitride or carbonitride of $Al_aCr_bM1_{(1-a-b)}$, and respective atomic ratios of metal atoms in the A layer satisfy $0.5 \leq a \leq 0.9$, $0 < b \leq 0.4$, and $0 \leq (1-a-b) \leq 0.1$,
each of the one or plurality of the B layers is composed of a nitride or carbonitride of $Al_cTi_dM2_{(1-c-d)}$, and respective atomic ratios of metal atoms in the B layer satisfy $0.3 \leq c \leq 0.7$, $0.3 \leq d \leq 0.7$, and $0 \leq (1-c-d) \leq 0.1$,
each of the one or plurality of the C layers is composed of a nitride or carbonitride of $Ti_eSi_fM3_{(1-e-f)}$, and respective atomic ratios of metal atoms in the C layer satisfy $0.75 \leq e \leq 0.99$, $0.01 \leq f \leq 0.2$, and $0 \leq (1-e-f) \leq 0.1$,
each of the one or plurality of the D layers is composed of a nitride or carbonitride of $Ti_gSi_hM4_{(1-g-h)}$, and respective atomic ratios of metal atoms in the D layer satisfy $0.8 \leq g \leq 0.99$, $0.01 \leq h \leq 0.2$, and $0 \leq (1-g-h) \leq 0.1$,
the atomic ratio e of Ti in the C layer and the atomic ratio g of Ti in the D layer satisfy $0.05 \leq |g-e| \leq 0.2$,
the atomic ratio f of Si in the C layer and the atomic ratio h of Si in the D layer satisfy $0.05 \leq |h-f| \leq 0.2$,
each of the M1 and the M2 is independently one or more elements selected from a group consisting of Si and B, and
each of the M3 and the M4 is independently one or more elements selected from a group consisting of Ta and B.

2. The surface-coated cutting tool according to claim 1, wherein
the coating film further includes an intermediate layer between the first alternating layer and the second alternating layer, and
the intermediate layer is an alternating layer of the A and C layers, an alternating layer of the A and D layers, an alternating layer of the B and C layers, or an alternating layer of the B and D layers.

3. The surface-coated cutting tool according to claim 1, wherein an uppermost layer of the first alternating layer is the B layer.

4. The surface-coated cutting tool according to claim 1, wherein a lowermost layer of the first alternating layer is the A layer or the B layer.

5. The surface-coated cutting tool according to claim 1, wherein
the A layer in the first alternating layer has a thickness $\lambda a$ of more than or equal to 0.005 μm and less than or equal to 2 μm,
the B layer in the first alternating layer has a thickness $\lambda b$ of more than or equal to 0.002 μm and less than or equal to 2 μm, and
a ratio $\lambda a/\lambda b$ of the thickness of the A layer in the first alternating layer and the thickness of the B layer in the first alternating layer satisfies $1 \leq \lambda a/\lambda b \leq 5$.

6. The surface-coated cutting tool according to claim 1, wherein
the C layer in the second alternating layer has a thickness $\lambda c$ of more than or equal to 0.005 μm and less than or equal to 2 μm,
the D layer in the second alternating layer has a thickness $\lambda d$ of more than or equal to 0.001 μm and less than or equal to 2 μm, and
a ratio $\lambda c/\lambda d$ of the thickness of the C layer in the second alternating layer and the thickness of the D layer in the second alternating layer satisfies $1 \leq \lambda c/\lambda d \leq 5$.

7. The surface-coated cutting tool according to claim 1, wherein the coating film has an entire thickness of more than or equal to 0.5 μm and less than or equal to 15 μm.

8. The surface-coated cutting tool according to claim 1, wherein
the coating film further includes an adhesion layer between the base material and the first alternating layer,
the adhesion layer has a thickness of more than or equal to 0.5 nm and less than or equal to 20 nm, and
the adhesion layer includes a carbide, nitride, or carbonitride including one or more first elements, one or more second elements, and one or more third elements, the one or more first elements being selected from a group consisting of Cr, Ti, Zr and Nb, the one or more second elements being selected from elements of the base material, the one or more third elements being selected from the elements of the first alternating layer or the second alternating layer.

9. The surface-coated cutting tool according to claim 8, wherein the one or more second elements at least include W.

10. The surface-coated cutting tool according to claim 9, wherein
the base material includes hard particles containing WC and a binder phase for binding the hard particles to each other,
the binder phase includes Co,
the adhesion layer includes a carbide, nitride, or carbonitride including W, Cr, Ti, Al, and M5, and
the M5 is one or more elements selected from a group consisting of a group 4 element, a group 5 element, a group 6 element except W, Cr, and Ti in a periodic table, Si and B.

11. The surface-coated cutting tool according to claim 1, wherein the first alternating layer includes a cubic crystal structure, and the second alternating layer includes a cubic crystal structure.

12. A method for manufacturing the surface-coated cutting tool recited in claim 1, the method comprising:
preparing the base material; and
forming the first alternating layer by using a physical vapor deposition method to alternately layer the one or plurality of the A layers and the one or plurality of the B layers on the base material; and
forming the second alternating layer by using the physical vapor deposition method to alternately layer the one or plurality of the C layers and the one or plurality of the D layers on the first alternating layer.

13. The method for manufacturing the surface-coated cutting tool according to claim 12, wherein the physical vapor deposition method is at least one selected from a group consisting of a cathode arc ion plating method, a balanced magnetron sputtering method, and an unbalanced magnetron sputtering method.

* * * * *